(12) United States Patent
Tanaka

(10) Patent No.: US 8,492,248 B2
(45) Date of Patent: Jul. 23, 2013

(54) MANUFACTURING METHOD OF SEMICONDUCTOR SUBSTRATE

(75) Inventor: Koichiro Tanaka, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/040,302

(22) Filed: Mar. 4, 2011

(65) Prior Publication Data

US 2011/0151593 A1  Jun. 23, 2011

Related U.S. Application Data

(62) Division of application No. 12/356,575, filed on Jan. 21, 2009, now Pat. No. 7,910,465.

(30) Foreign Application Priority Data

Jan. 24, 2008 (JP) ................................. 2008-014147

(51) Int. Cl.
*H01L 21/322* (2006.01)

(52) U.S. Cl.
USPC ............. 438/473; 438/487; 257/E21.317; 257/E21.319

(58) Field of Classification Search
USPC ........... 438/487, 473; 257/E21.028, E21.317, 257/E21.319
See application file for complete search history.

(56) References Cited

U.S. PATENT DOCUMENTS

| 5,064,775 | A | 11/1991 | Chang |
|---|---|---|---|
| 5,104,818 | A | 4/1992 | Silver |
| 5,374,564 | A | 12/1994 | Bruel |
| 5,643,826 | A | 7/1997 | Ohtani et al. |
| 5,893,990 | A | 4/1999 | Tanaka |
| 5,904,509 | A | 5/1999 | Zhang et al. |

(Continued)

FOREIGN PATENT DOCUMENTS

| EP | 0651431 A | 5/1995 |
|---|---|---|
| EP | 1158580 A | 11/2001 |

(Continued)

OTHER PUBLICATIONS

Wolf et al., Silicon Processing for the VLSI Era, 1986, vol. 1: Process Technology, pp. 323-325, Lattice Press.

(Continued)

*Primary Examiner* — William D Coleman
*Assistant Examiner* — Christine Enad
(74) *Attorney, Agent, or Firm* — Eric J. Robinson; Robinson Intellectual Property Law Office, P.C.

(57) ABSTRACT

A surface of a single crystal semiconductor substrate is irradiated with ions to form a damaged region, an insulating layer is formed over the surface of the single crystal semiconductor substrate, and a surface of a substrate having an insulating surface is made to be in contact with a surface of the insulating layer to bond the substrate having an insulating surface to the single crystal semiconductor substrate. Then, the single crystal semiconductor substrate is separated at the damaged region by performing heat treatment to form a single crystal semiconductor layer over the substrate having an insulating surface, and the single crystal semiconductor layer is patterned to form a plurality of island-shaped semiconductor layers. One of the island-shaped semiconductor layers is irradiated with a laser beam which is shaped to entirely cover the island-shaped semiconductor layer.

32 Claims, 17 Drawing Sheets

U.S. PATENT DOCUMENTS

| | | | |
|---|---|---|---|
| 5,923,962 A | 7/1999 | Ohtani et al. | |
| 6,013,563 A | 1/2000 | Henley et al. | |
| 6,127,702 A | 10/2000 | Yamazaki et al. | |
| 6,191,008 B1 | 2/2001 | So | |
| 6,242,320 B1 | 6/2001 | So | |
| 6,271,101 B1 | 8/2001 | Fukunaga | |
| 6,285,042 B1 | 9/2001 | Ohtani et al. | |
| 6,312,797 B1 | 11/2001 | Yokokawa et al. | |
| 6,335,231 B1 | 1/2002 | Yamazaki et al. | |
| 6,335,541 B1 | 1/2002 | Ohtani et al. | |
| 6,372,609 B1 | 4/2002 | Aga et al. | |
| 6,380,046 B1 | 4/2002 | Yamazaki | |
| 6,388,652 B1 | 5/2002 | Yamazaki et al. | |
| 6,455,360 B1 | 9/2002 | Miyasaka | |
| 6,468,923 B1 | 10/2002 | Yonehara et al. | |
| 6,534,380 B1 | 3/2003 | Yamauchi et al. | |
| 6,602,761 B2 | 8/2003 | Fukunaga | |
| 6,677,222 B1 | 1/2004 | Mishima et al. | |
| 6,686,623 B2 | 2/2004 | Yamazaki | |
| 6,746,942 B2 | 6/2004 | Sakamoto et al. | |
| 6,767,802 B1 * | 7/2004 | Maa et al. | 438/406 |
| 6,778,164 B2 | 8/2004 | Yamazaki et al. | |
| 6,803,264 B2 | 10/2004 | Yamazaki et al. | |
| 6,803,296 B2 | 10/2004 | Miyairi | |
| 6,875,633 B2 | 4/2005 | Fukunaga | |
| 6,908,797 B2 | 6/2005 | Takano | |
| 6,998,639 B2 | 2/2006 | Ohtani et al. | |
| 7,001,829 B1 | 2/2006 | Yamazaki | |
| 7,011,707 B2 * | 3/2006 | Nagai et al. | 117/94 |
| 7,119,365 B2 | 10/2006 | Takafuji et al. | |
| RE39,484 E | 2/2007 | Bruel | |
| 7,176,525 B2 | 2/2007 | Fukunaga | |
| 7,176,528 B2 | 2/2007 | Couillard et al. | |
| 7,192,844 B2 | 3/2007 | Couillard et al. | |
| 7,199,024 B2 | 4/2007 | Yamazaki | |
| 7,253,032 B2 | 8/2007 | Yamazaki et al. | |
| 7,256,776 B2 | 8/2007 | Yamazaki et al. | |
| 7,365,358 B2 | 4/2008 | Sato et al. | |
| 7,473,971 B2 | 1/2009 | Yamazaki et al. | |
| 7,476,576 B2 | 1/2009 | Yamazaki et al. | |
| 7,508,034 B2 | 3/2009 | Takafuji et al. | |
| 7,535,053 B2 | 5/2009 | Yamazaki | |
| 7,579,654 B2 | 8/2009 | Couillard et al. | |
| 7,619,250 B2 | 11/2009 | Takafuji et al. | |
| 7,632,739 B2 | 12/2009 | Hebras | |
| 7,709,309 B2 | 5/2010 | Moriwaka | |
| 7,714,251 B2 | 5/2010 | Miyairi | |
| 7,745,268 B2 | 6/2010 | Miyairi | |
| 7,867,873 B2 | 1/2011 | Murakami et al. | |
| 7,978,190 B2 | 7/2011 | Yamazaki et al. | |
| 8,034,694 B2 | 10/2011 | Ohnuma et al. | |
| 2005/0118349 A1 * | 6/2005 | Whitehead et al. | 427/523 |
| 2005/0260800 A1 | 11/2005 | Takano | |
| 2006/0038228 A1 | 2/2006 | Aitken et al. | |
| 2006/0099773 A1 | 5/2006 | Maa et al. | |
| 2006/0110899 A1 | 5/2006 | Bourdelle et al. | |
| 2006/0131583 A1 | 6/2006 | Ohtani et al. | |
| 2007/0020947 A1 | 1/2007 | Daval et al. | |
| 2007/0087488 A1 * | 4/2007 | Moriwaka | 438/149 |
| 2007/0108510 A1 | 5/2007 | Fukunaga | |
| 2007/0173000 A1 * | 7/2007 | Yamazaki | 438/151 |
| 2007/0281399 A1 * | 12/2007 | Cites et al. | 438/149 |
| 2007/0291022 A1 | 12/2007 | Yamazaki et al. | |
| 2008/0308866 A1 | 12/2008 | Miyairi | |
| 2009/0023267 A1 | 1/2009 | Daval et al. | |
| 2009/0023271 A1 | 1/2009 | Couillard et al. | |
| 2009/0029525 A1 | 1/2009 | Ohnuma | |
| 2009/0095956 A1 | 4/2009 | Takafuji et al. | |
| 2009/0104750 A1 * | 4/2009 | Yamazaki et al. | 438/406 |
| 2009/0117716 A1 | 5/2009 | Shimomura et al. | |
| 2010/0019242 A1 | 1/2010 | Takafuji et al. | |

FOREIGN PATENT DOCUMENTS

| | | |
|---|---|---|
| JP | 58-156591 | 9/1983 |
| JP | 07-130652 A | 5/1995 |
| JP | 11-097379 | 4/1999 |
| JP | 11-163363 A | 6/1999 |
| JP | 2003-257992 | 9/2003 |
| JP | 2005-252244 A | 9/2005 |

OTHER PUBLICATIONS

Zehner et al., "Preparation of atomically clean silicon surfaces by pulsed laser irradiation," Appl. Phys. Lett. (Applied Physics Letters) Jan. 1, 1980, vol. 36, No. 1, pp. 56-59.

Lu.F et al., "Ion-Cutting of Si Onto Glass by Pulsed and Direct-Current Plasma Immersion Ion Implantation,", J. Vac. Sci. Technol. B (Journal of Vacuum Science & Technology B), 2003, vol. 21, No. 5, pp. 2109-2113.

* cited by examiner

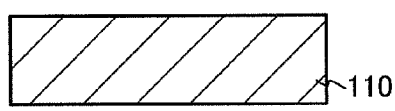
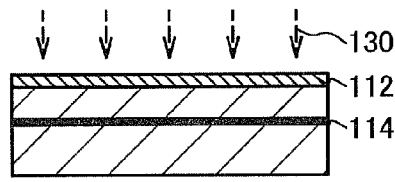
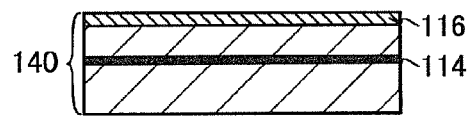
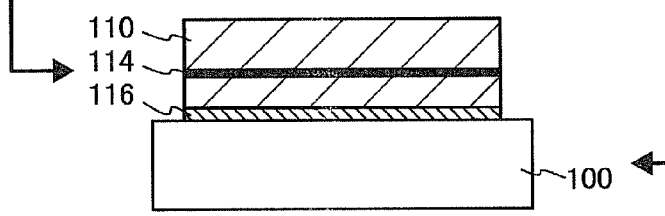
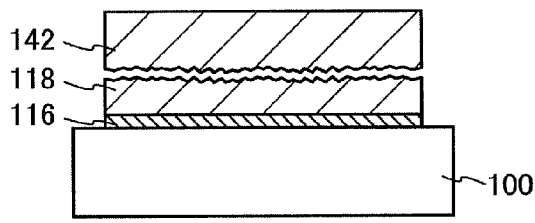

MANUFACTURING METHOD OF SEMICONDUCTOR SUBSTRATE

BACKGROUND OF THE INVENTION

1. Field of the Invention

The present invention relates to a manufacturing method of a semiconductor substrate.

2. Description of the Related Art

In recent years, integrated circuits using an SOI (silicon on insulator) substrate, instead of using a bulk silicon substrate, have been developed. By utilizing the characteristics of a thin single crystal silicon layer formed over an insulating layer, transistors formed in the integrated circuit can be completely separated from each other, and further, the fully depleted transistors can be formed. Accordingly, a semiconductor integrated circuit with high added value such as high integration, high speed driving, and low power consumption can be realized.

As a manufacturing method of an SOI substrate, a hydrogen-ion-implantation separation method in which hydrogen ion implantation and separation are combined is known. A typical process of the hydrogen-ion-implantation separation method will be described below.

First, hydrogen ions are implanted into a silicon substrate to form an ion implantation layer at a predetermined depth from the surface. Next, a silicon oxide film is formed by oxidation of another silicon substrate which serves as a base substrate. After that, the silicon substrate into which the hydrogen ions are implanted and the silicon oxide film on the other silicon substrate are firmly attached to each other to bond the two silicon substrates. Then, heat treatment is performed, whereby one of the silicon substrates is cleaved using the ion implantation layer as a cleavage plane.

There is a known method in which a single crystal silicon layer is formed over a glass substrate by using a hydrogen-ion-implantation separation method (e.g., Reference 1: Japanese Published Patent Application No. H11-097379). In Reference 1, a separation plane is mechanically polished in order to remove a defect layer formed by ion implantation or a step in the separation plane.

SUMMARY OF THE INVENTION

In the case where a single crystal semiconductor layer is formed by using an ion-implantation separation method in the above-described manner, the ion implantation increases defects in the single crystal semiconductor layer. In a situation that many defects exist in a single crystal semiconductor layer, defect levels are easily generated at the interface with a gate insulating film, for example; accordingly, a semiconductor element manufactured using this single crystal semiconductor layer does not have favorable characteristics. Further, in the case where many defects exist in a single crystal semiconductor layer, original characteristics of the single crystal semiconductor cannot be obtained.

As a solution for the above problems, for example, heating at a high temperature (at 800° C. or higher) or treatment such as grinding and polishing can be given. However, heating at a high temperature or treatment such as grinding and polishing is not appropriate for treatment on a single crystal semiconductor layer formed over a glass substrate. This is because a glass substrate has an allowable temperature limit of approximately 650° C. and has a larger size than a silicon substrate or the like.

As an alternative method, a method for irradiating a single crystal semiconductor layer with a laser beam is given, for example. By irradiation with a laser beam, only the single crystal semiconductor layer is selectively melted, whereby defects can be reduced. As the laser beam, a pulse-oscillation laser beam is mainly used. The pulse-oscillation laser beam (hereinafter also referred to as a pulsed laser beam) has an advantage that a desired intensity is easily obtained as compared to the case of using a continuous-wave laser beam (hereinafter also referred to as a CW laser beam).

Here, in the case of irradiating a single crystal semiconductor layer with a pulsed laser beam, there is a problem in that surface unevenness of the single crystal semiconductor layer increases in a region irradiated with an edge portion of a pulsed laser beam. This is caused because a melted region and an unmelted region are mixed in the irradiated region and, therefore, a distortion is easily generated at a boundary between the melted region and the unmelted region in the single crystal semiconductor layer. As a method of reducing such a distortion, a method in which irradiation with many pulsed laser beams is performed while the irradiation position is moved little by little can be given; however, this method has a problem of low throughput.

In consideration of the above-described problems, it is an object to improve planarity of a surface of a semiconductor layer in a semiconductor substrate. Further, it is another object to improve productivity of semiconductor substrates.

In the invention disclosed in this specification, a semiconductor layer is patterned into an island shape before irradiation with a pulsed laser beam to form an island-shaped semiconductor layer, and the island-shaped semiconductor layer is not irradiated with an edge portion of a pulsed laser beam (a region in which a boundary between a solid state and a liquid state is generated). That is, the entire surface of the island-shaped semiconductor layer obtained by the patterning is irradiated with a predetermined region of a pulsed laser beam.

According to an aspect of a manufacturing method of a semiconductor substrate disclosed in this specification, a surface of a single crystal semiconductor substrate is irradiated with ions to form a damaged region; an insulating layer is formed over the surface of the single crystal semiconductor substrate; and a surface of a substrate having an insulating surface is made to be in contact with a surface of the insulating layer to bond the substrate having an insulating surface to the single crystal semiconductor substrate. Then, the single crystal semiconductor substrate is separated at the damaged region by performing heat treatment, to form a single crystal semiconductor layer over the substrate having an insulating surface; the single crystal semiconductor layer is patterned to form a plurality of island-shaped semiconductor layers; and one of the island-shaped semiconductor layers is irradiated with a laser beam which is shaped to entirely cover the one island-shaped semiconductor layer. Here, irradiation with ions refers to irradiation of an object with ions which are accelerated by an electric field. Accordingly, a region where a composition, atomic arrangement, or the like of the object is changed (a damaged region) can be formed at a predetermined depth from the surface of the object.

According to another aspect of a manufacturing method of a semiconductor substrate disclosed in this specification, a surface of a single crystal semiconductor substrate is irradiated with ions to form a damaged region; a first insulating layer is formed over the surface of the single crystal semiconductor substrate; and a second insulating layer is formed over a surface of a substrate having an insulating surface. Then, a surface of the second insulating layer is made to be in contact with a surface of the first insulating layer to bond the substrate having an insulating surface to the single crystal semiconductor substrate; and the single crystal semiconductor substrate is separated at the damaged region by performing heat treatment, to form a single crystal semiconductor layer over the substrate having an insulating surface. Then, the single crystal semiconductor layer is patterned to form a plurality of island-shaped semiconductor layers, and one of the island-shaped semiconductor layers is irradiated with a laser beam which is shaped to entirely cover the one island-shaped semiconductor layer.

According to another aspect of a manufacturing method of a semiconductor substrate disclosed in this specification, a surface of a single crystal semiconductor substrate is irradiated with ions to form a damaged region; the single crystal semiconductor substrate is patterned to form a recessed portion, a bottom of which is deeper than the damaged region; and an insulating layer is formed over the surface of the single crystal semiconductor substrate. Then, a surface of a substrate having an insulating surface is made to be in contact with a surface of the insulating layer to bond the substrate having an insulating surface to the single crystal semiconductor substrate; and the single crystal semiconductor substrate is separated at the damaged region by performing heat treatment, to form a plurality of island-shaped semiconductor layers over the substrate having an insulating surface. Then, one of the island-shaped semiconductor layers is irradiated with a laser beam which is shaped to entirely cover the island-shaped semiconductor layer.

According to another aspect of a manufacturing method of a semiconductor substrate disclosed in this specification, a surface of a single crystal semiconductor substrate is irradiated with ions to form a damaged region; and the single crystal semiconductor substrate is patterned to form a recessed portion, a bottom of which is deeper than the damaged region. Then, a first insulating layer is formed over the surface of the single crystal semiconductor substrate; a second insulating layer is formed over a surface of a substrate having an insulating surface; and a surface of the second insulating layer is made to be in contact with a surface of the first insulating layer to bond the substrate having an insulating surface to the single crystal semiconductor substrate. Then, the single crystal semiconductor substrate is separated at the damaged region by performing heat treatment, to form a plurality of island-shaped semiconductor layers over the substrate having an insulating surface; and one of the island-shaped semiconductor layers is irradiated with a laser beam which is shaped to entirely cover the island-shaped semiconductor layer.

In the above-described structures, the one of the island-shaped semiconductor layers is irradiated with a center portion of the laser beam (that is, the one of the island-shaped semiconductor layers is not irradiated with an edge portion of the laser beam). Here, the center portion of the laser beam is a portion except a portion which produces surface unevenness when a semiconductor layer is irradiated with the portion (i.e., a portion which produces a boundary between a solid state and a liquid state). For example, the portion can have an intensity of equal to or higher than 80% of a peak intensity of the laser beam. Here, the surface unevenness means surface unevenness in such a level as to cause a problem in manufacture of a semiconductor device. Note that the positional relationship between the laser beam and the island-shaped semiconductor layer is not limited as long as the island-shaped semiconductor layer is not irradiated with the "portion which produces surface unevenness", and is not interpreted as being limited to the above structure. For example, the positional relationship may be such that irradiation with the "portion which produces surface unevenness" is performed on a region between island-shaped semiconductor layers.

In the above-described structures, irradiation with the laser beam is preferably performed in a reduced-pressure atmosphere. For example, the irradiation can be performed at a pressure of equal to or lower than 50 Pa (preferably, equal to or lower than $5\times10^{-1}$ Pa, more preferably equal to or lower than $5\times10^{-3}$ Pa).

In the above-described structures, in the case where it is judged that the island-shaped semiconductor layer is in an unmelted state by evaluation of the melted state of the island-shaped semiconductor layer by the irradiation with the laser beam, the island-shaped semiconductor layer can be irradiated with a laser beam again. In this case, the evaluation of the melted state of the island-shaped semiconductor layer by the irradiation with the laser beam can be performed in such a manner that when the island-shaped semiconductor layer is irradiated with the laser beam, a surface or a rear surface of the island-shaped semiconductor layer is irradiated with a reference beam having a predetermined wavelength and a reflectance of the reference beam is measured. For example, a first reflectance and a second reflectance are used as references, and if the reflectance is lower than the first reflectance, it can be judged that the island-shaped semiconductor layer is in an unmelted state; if the reflectance is equal to or higher than the first reflectance and lower than the second reflectance, it can be judged that the island-shaped semiconductor layer is in a partially-melted state; and if the reflectance is equal to or higher than the second reflectance, it can be judged that the island-shaped semiconductor layer is in a completely-melted state. Further, in the above-described structure, the first reflectance can be a reflectance in the case where the surface of the island-shaped semiconductor layer is in a melted state, and the second reflectance can be a reflectance in the case where the rear surface of the island-shaped semiconductor layer is in a melted state.

In the invention disclosed in this specification, a laser beam is shaped in accordance with the shape or the like of an island-shaped semiconductor layer. Alternatively, a semiconductor layer is patterned in accordance with an irradiation region of a laser beam. Accordingly, a semiconductor layer is not irradiated with an edge portion of a laser beam but is irradiated with a center portion of a laser beam, whereby surface unevenness caused by irradiation with the edge portion of the laser beam can be suppressed and a semiconductor substrate including a highly planar semiconductor layer can be provided. In addition, since irradiation with many pulsed laser beams for suppressing the surface unevenness is not needed, efficiency in manufacturing a semiconductor substrate can be improved.

BRIEF DESCRIPTION OF THE DRAWINGS

In the accompanying drawings:

FIGS. 1A to 1F illustrate a manufacturing method of a semiconductor substrate;

DETAILED DESCRIPTION OF THE INVENTION

Figure 2A:
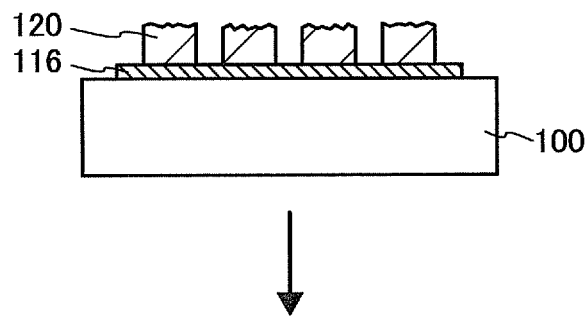
FIGS. 2A to 2D illustrate a manufacturing method of a semiconductor substrate.
Figure 2B:
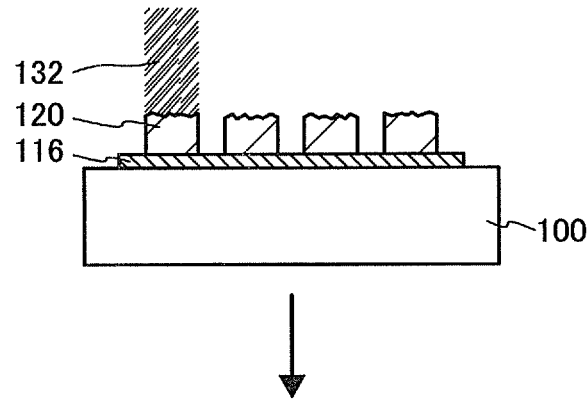
Figure 2C:
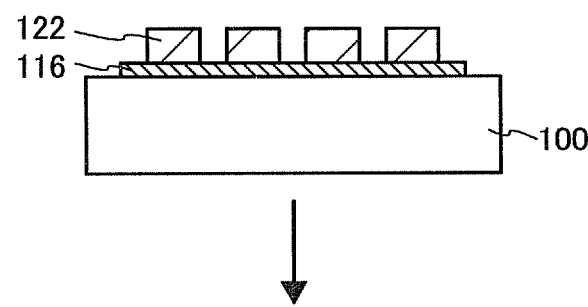
Figure 2D:
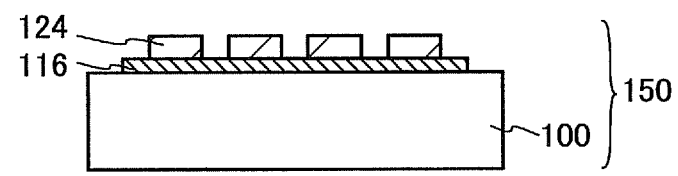

Embodiment modes will be described below with reference to the drawings. However, the present invention is not limited to the following description. It is obvious to those skilled in the art that the mode and details can be changed in various ways without departing from the spirit of the invention. Note that the same reference numerals are commonly used to denote the same components among different drawings in structures explained below. In addition, the semiconductor device in this specification indicates all devices that operate by utilizing semiconductor characteristics.

Embodiment Mode 1

In Embodiment Mode 1, a manufacturing method of a semiconductor substrate will be described with reference to FIGS. 1A to 1F, FIGS. 2A to 2D, FIGS. 3A to 3C, and FIGS. 4A to 4C.

First, a base substrate 100 is prepared (see FIG. 1A). As the base substrate 100, a visible light transmitting glass substrate used for a liquid crystal display device or the like can be used, for example. As a glass substrate, a substrate having a strain point of equal to or higher than 580° C. and equal to or lower than 680° C. (preferably, equal to or higher than 600° C. and equal to or lower than 680° C.) may be used. Further, it is preferable that the glass substrate be a non-alkali glass substrate. As a material of the non-alkali glass substrate, a glass material such as aluminosilicate glass, aluminoborosilicate glass, or barium borosilicate glass is used, for example.

Note that as the base substrate 100, as well as the glass substrate, an insulating substrate which is formed of an insulator, such as a ceramic substrate, a quartz substrate, or a sapphire substrate; a semiconductor substrate which is formed of a semiconductor material such as silicon; a conductive substrate which is formed of a conductor such as metal or stainless steel; or the like can also be used.

Although not described in this embodiment mode, an insulating layer may be formed over a surface of the base substrate 100. By providing the insulating layer, even in the case where impurities (such as an alkali metal or an alkaline earth metal) are included in the base substrate 100, the impurities can be prevented from being diffused into a semiconductor layer. The insulating layer may have either a single-layer structure or a stacked structure. As a material of the insulating layer, silicon oxide, silicon nitride, silicon oxynitride, silicon nitride oxide, aluminum oxide, aluminum nitride, aluminum oxynitride, aluminum nitride oxide, or the like can be given.

Note that in this specification, an oxynitride is a substance that contains more oxygen than nitrogen, and a nitride oxide is a substance that contains more nitrogen than oxygen. For example, silicon oxynitride is a substance including oxygen, nitrogen, silicon, and hydrogen in ranges of 50 at. % to 70 at. % inclusive, 0.5 at. % to 15 at. % inclusive, 25 at. % to 35 at. % inclusive, and 0.1 at. % to 10 at. % inclusive, respectively. Further, silicon nitride oxide is a substance including oxygen, nitrogen, silicon, and hydrogen in ranges of 5 at. % to 30 at. % inclusive, 20 at. % to 55 at. % inclusive, 25 at. % to 35 at. % inclusive, and 10 at. % to 25 at. % inclusive, respectively. Note that the above-described ranges are obtained by measurement using Rutherford backscattering spectrometry (RBS) or hydrogen forward scattering (HFS). Moreover, the total for the content ratio of the constituent elements is maximum at 100 at. %.

Next, a single crystal semiconductor substrate 110 is prepared (see FIG. 1B). As the single crystal semiconductor substrate 110, for example, a semiconductor substrate formed from an element belonging to Group 4 of the periodic table, such as silicon, germanium, silicon-germanium, or silicon carbide can be used. Needless to say, a substrate formed from a compound semiconductor such as gallium arsenide or indium phosphide may be used. In this embodiment mode, as the single crystal semiconductor substrate 110, a single crystal silicon substrate is used. Although there is no limitation on the size or the shape of the single crystal semiconductor substrate 110, for example, it is preferable to process a circular semiconductor substrate of 8 inches (200 nm) in diameter, 12 inches (300 nm) in diameter, 18 inches (450 nm) in diameter or the like, into a rectangular shape and to use the processed substrate. In this specification, the term "single crystal" means a crystal which has a crystal structure with certain regularity and in which crystal axes are aligned in the same direction in any part of the crystal. That is, the "single crystal" is defined regardless of the amount of defects.

After the single crystal semiconductor substrate 110 is cleaned, an insulating layer 112 is formed over a surface of the single crystal semiconductor substrate 110. The insulating layer 112 is not necessarily provided. However, for preventing contamination of the single crystal semiconductor substrate 110, damage to the surface of the single crystal semiconductor substrate 110, etching of the surface of the single crystal semiconductor substrate 110, and the like due to later ion irradiation, it is preferable to provide the insulating layer 112. The thickness of the insulating layer 112 may be approximately equal to or greater than 1 nm and equal to or less than 400 nm.

As a material of the insulating layer 112, an insulating material containing silicon or germanium as a component, such as silicon oxide, silicon nitride, silicon oxynitride, silicon nitride oxide, germanium oxide, germanium nitride, germanium oxynitride, or germanium nitride oxide can be used. Further, a metal oxide such as aluminum oxide, tantalum oxide, or hafnium oxide; a metal nitride such as aluminum nitride; a metal oxynitride such as aluminum oxynitride; or a metal nitride oxide such as aluminum nitride oxide may also be used. The insulating layer 112 can be formed by a CVD method, a sputtering method, a method using oxidation (or nitridation) of the single crystal semiconductor substrate 110, or the like.

Next, the single crystal semiconductor substrate 110 is irradiated with an ion beam 130 including ions accelerated by an electric field through the insulating layer 112, so that a damaged region 114 is formed in a region at a predetermined depth from the surface of the single crystal semiconductor substrate 110 (see FIG. 1C). The depth of the region where the damaged region 114 is formed can be controlled by acceleration energy and incident angle of the ion beam 130. The damaged region 114 is formed in a region at a depth the same or substantially the same as the average penetration depth of the ions.

The thickness of a single crystal semiconductor layer which is separated from the single crystal semiconductor substrate 110 is determined depending on the depth at which the damaged region 114 is formed. The depth at which the damaged region 114 is formed is equal to or greater than 20 nm and equal to or less than 500 nm, preferably equal to or greater than 30 nm and equal to or less than 200 nm, from the surface of the single crystal semiconductor substrate 110.

When the single crystal semiconductor substrate 110 is irradiated with ions, an ion implantation apparatus or an ion doping apparatus can be used. In an ion implantation apparatus, a source gas is excited to produce ion species, the produced ion species are mass-separated, and ion species each having a predetermined mass is implanted in a process object. In an ion doping apparatus, a process gas is excited to produce ion species, the produced ion species are not mass-separated, and a process object is irradiated with the produced ion species. Note that in the ion doping apparatus provided with a mass separator, ion irradiation with mass separation can also be performed as in the ion implantation apparatus.

The ion irradiation step with an ion doping apparatus can be performed, for example, under the following conditions.

Acceleration voltage: from 5 kV to 100 kV, inclusive (preferably from 30 kV to 80 kV, inclusive)

Dose: from $6 \times 10^{15}$ ions/cm$^2$ to $4 \times 10^{16}$ ions/cm$^2$, inclusive Beam current intensity: equal to or higher than 2 μA/cm$^2$ (preferably equal to or higher than 5 μA/cm$^2$, more preferably equal to or higher than 10 μA/cm$^2$)

In the case of using an ion doping apparatus, a gas containing hydrogen can be used as a source gas for the ion irradiation step. With the gas containing hydrogen, $H^+$, $H_2^+$, and $H_3^+$ can be produced as ion species. In the case where the gas containing hydrogen is used as a source gas, it is preferable to perform irradiation with a large number of $H_3^+$. Specifically, the proportion of $H_3^+$ ions with respect to the total amount of $H^+$, $H_2^+$, and $H_3^+$ in the ion beam 130 is preferably equal to or higher than 70%; more preferably, the proportion of $H_3^+$ ions is equal to or higher than 80%. By increasing the proportion of $H_3^+$ in this manner, the damaged region 114 can contain hydrogen at a concentration of equal to or higher than $1 \times 10^{20}$ atoms/cm$^3$. Such local irradiation with a large number of ions facilitates separation at the damaged region 114. In addition, by irradiation with a large number of $H_3^+$ ions, ion irradiation efficiency is improved compared to the case of irradiation with $H^+$ or $H_2^+$. That is, the time needed for the ion irradiation can be shortened.

When the ion implantation apparatus is used, it is preferable to implant $H_3^+$ ions through mass separation. Of course, $H^+$ ions or $H_2^+$ ions may be implanted. Note that, in the case of using an ion implantation apparatus, ion irradiation efficiency may be reduced compared to the case of using an ion doping apparatus because ion species are selectively implanted.

As a source gas for the ion irradiation step, as well as a gas containing hydrogen, one or more kinds of gases selected from a rare gas such as helium or argon; a halogen gas typified by a fluorine gas or a chlorine gas; or a halogen compound gas such as a fluorine compound gas (e.g., $BF_3$) can be used. In the case where helium is used as a source gas, the ion beam 130 with a high proportion of $He^+$ ions can be produced without mass separation. By using the ion beam 130, the damaged region 114 can be efficiently formed.

Further, the damaged region 114 can also be formed by performing the ion irradiation step plural times. In this case, different source gases may be used for each of the ion irradiation steps or the same source gas may be used for the ion irradiation steps. For example, ion irradiation can be performed using a gas containing hydrogen as a source gas after ion irradiation is performed using a rare gas as a source gas. Alternatively, first, ion irradiation can be performed using a halogen gas or a halogen compound gas, and then, ion irradiation can be performed using a gas containing hydrogen.

After formation of the damaged region 114, the insulating layer 112 is removed and an insulating layer 116 is newly formed (see FIG. 1D). Here, the insulating layer 112 is removed because there is a high possibility that the insulating layer 112 may be damaged in the ion irradiation. If damage of the insulating layer 112 does not cause any problems, it is not necessary to remove the insulating layer 112. In this case, the insulating layer 116 may be newly formed over the insulating layer 112, or a structure in which the insulating layer 116 is not formed may be employed.

As a material of the insulating layer 116, an insulating material containing silicon or germanium as a component, such as silicon oxide, silicon nitride, silicon oxynitride, silicon nitride oxide, germanium oxide, germanium nitride, germanium oxynitride, or germanium nitride oxide can be used. Further, a metal oxide such as aluminum oxide, tantalum oxide, or hafnium oxide; a metal nitride such as aluminum nitride; a metal oxynitride such as aluminum oxynitride; or a metal nitride oxide such as aluminum nitride oxide may also be used. As a formation method of the insulating layer 116, a CVD method, a sputtering method, a method using oxidation (or nitridation) of the single crystal semiconductor substrate 110, or the like can be given. Note that the insulating layer 116 has a single-layer structure in this embodiment mode; however, the invention disclosed in this specification is not interpreted as being limited thereto. The insulating layer 116 can have a stacked structure of two or more layers.

Since the insulating layer 116 is a layer to be bonded, the surface thereof preferably has high planarity. For example, a layer with a surface having an arithmetic mean roughness of 0.6 nm or less (preferably 0.3 nm or less) and a root-mean-square roughness of 0.7 nm or less (preferably 0.4 nm or less) is formed. As such an insulating layer 116, a silicon oxide film formed by a chemical vapor deposition method using an organosilane gas can be used, for example. Note that the structure illustrated in FIG. 1D is hereinafter referred to as a substrate 140 for convenience.

Then, the base substrate 100 and the substrate 140 are bonded to each other (see FIG. 1E). Specifically, after surfaces of the base substrate 100 and the substrate 140 are cleaned by a method such as ultrasonic cleaning (with a frequency of 50 kHz to 5 MHz, so called megasonic cleaning) and subjected to treatment using a chemical solution which provides hydrophilic groups (such as ozone water, a mixture of ammonium water and a hydrogen peroxide solution (and water), or another oxidizing agent), the surfaces of the base substrate 100 and the substrate 140 are attached to each other and pressure is applied thereto. As treatment on the surfaces of the base substrate 100 and the substrate 140, as well as the treatment using a chemical solution, oxygen plasma treatment can be given, for example.

Since it is considered that van der Waals' force, hydrogen bonding, or the like engages in bonding, a method which can make the best of these mechanisms relating to bonding is preferably used. For example, before bonding, there is a method of making the surfaces of the base substrate 100 and the substrate 140 hydrophilic by performing treatment with a chemical solution which provides hydrophilic groups or oxygen plasma treatment on the surfaces. By this treatment, hydrophilic groups are provided for the surfaces of the base substrate 100 and the substrate 140; accordingly, many hydrogen bonds can be formed at the bonding interface. That is, bonding strength can be increased.

The atmosphere at the time of bonding can be an air atmosphere, an inert atmosphere such as a nitrogen atmosphere, an atmosphere containing oxygen or ozone, or a reduced-pressure atmosphere. By performing bonding in the inert atmosphere or the atmosphere containing oxygen or ozone, the hydrophilic groups provided for the surfaces of the base substrate 100 and the substrate 140 can be efficiently utilized for bonding. Alternatively, bonding can also be performed in a reduced-pressure atmosphere. In this case, since the effect by contaminants in the atmosphere can be made small, the bonding interface can be kept clean. In addition, entry of air between the substrates in bonding can be reduced.

Next, heat treatment is performed on the base substrate 100 and the substrate 140 which are bonded to each other, to strengthen the bond. The heat treatment is performed as immediately as possible after the bonding. This is because, in the case where the substrates are transported before the heat treatment and after the bonding, there is a high possibility that the substrate 140 may be detached due to a sag of the base substrate 100.

The temperature of the above heat treatment needs to be a temperature which is equal to or lower than an allowable temperature limit of the base substrate and does not cause separation at the damaged region. For example, the temperature can be equal to or higher than 150° C. and equal to or lower than 450° C., preferably equal to or higher than 200° C. and equal to or lower than 400° C. The treatment time is preferably equal to or longer than 1 minute and equal to or shorter than 10 hours (more preferably equal to or longer than 3 minutes and equal to or shorter than 3 hours), but optimal conditions can be appropriately determined from the relationship between the treatment speed and the bonding strength. In this embodiment mode, the heat treatment is performed at 200° C. for two hours. Alternatively, heating can be locally performed by irradiating only the region of the substrates, at which bonding is performed, with microwaves.

Next, the substrate 140 is separated into a single crystal semiconductor substrate 142, and the insulating layer 116 and a single crystal semiconductor layer 118 (see FIG. 1F). Separation of the substrate 140 is conducted by heat treatment. The temperature of the heat treatment can be set in consideration of the allowable temperature limit of the base substrate 100. For example, when a glass substrate is used as the base substrate 100, the temperature of the heat treatment is preferably equal to or higher than 400° C. and equal to or lower than the strain point of glass. Note that in this embodiment mode, the heat treatment is performed at 600° C. for two hours.

By the above-described heat treatment, the volume of microvoids formed in the damaged region 114 is changed, whereby a crack is generated in the damaged region 114. As a result, the single crystal semiconductor substrate 110 is separated along the damaged region 114. Since the insulating layer 116 is bonded to the base substrate 100, the single crystal semiconductor layer 118 separated from the single crystal semiconductor substrate 110 remains over the base substrate 100. Further, since the bonding interface between the base substrate 100 and the insulating layer 116 is heated by this heat treatment, a covalent bond is formed at the bonding interface so that the bonding force between the base substrate 100 and the insulating layer 116 is further improved. The single crystal semiconductor substrate 142 can be utilized again after the surface thereof is planarized.

In the above-described manner, a semiconductor substrate having the single crystal semiconductor layer 118 over the base substrate 100 can be formed. The semiconductor substrate has a structure where the insulating layer 116 and the single crystal semiconductor layer 118 are sequentially stacked over the base substrate 100.

Defects due to the ion irradiation step or the separation step exist on the surface of the single crystal semiconductor layer 118 formed as described above, and planarity of the surface is impaired. In addition, if the single crystal semiconductor layer 118 has many crystal defects, original characteristics of the single crystal semiconductor cannot be exhibited, and performance and reliability of the transistor are adversely affected; for example, the localized interface state density between the single crystal semiconductor layer 118 and the gate insulating layer is increased. Furthermore, it is difficult to form a thin gate insulating layer having a high withstand voltage over such a surface having low planarity (i.e., large unevenness) of the single crystal semiconductor layer 118. Therefore, defect reduction treatment or planarization treatment is performed on the single crystal semiconductor layer 118.

In this embodiment mode, by irradiation of the single crystal semiconductor layer 118 with a pulsed laser beam 132, defects of the single crystal semiconductor layer 118 can be reduced and planarity of the single crystal semiconductor layer 118 can be improved. More specifically, the single crystal semiconductor layer 118 is divided into a plurality of island-shaped semiconductor layers 120 (see FIG. 2A), and then irradiation treatment with the pulsed laser beam 132 is performed (see FIG. 2B); accordingly, island-shaped semiconductor layers 122 with reduced defects and improved planarity can be formed (see FIG. 2C). The division of the single crystal semiconductor layer 118 into the island-shaped semiconductor layers 120 can be conducted by etching. A resist mask used in the etching treatment can be formed in such a manner that a resist material which is a photosensitive substance is applied and a pattern is formed by light exposure.

As a laser which emits the above-described pulsed laser beam, an Ar laser, a Kr laser, an excimer (ArF, KrF, or XeCl) laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a copper vapor laser, a gold vapor laser, or the like can be used.

It is necessary that the wavelength of the pulsed laser beam 132 be set to a wavelength which can be absorbed by the island-shaped semiconductor layers 120. The wavelength may be determined in consideration of the skin depth of the pulsed laser beam and the like. For example, the wavelength can be set in the range of 250 nm to 700 nm inclusive. In addition, the intensity (energy density) of the pulsed laser beam 132 can be determined in consideration of the wavelength of the pulsed laser beam 132, the skin depth of the pulsed laser beam 132, the thickness of the single crystal semiconductor layer 118, and the like. For example, the energy density can be set in the range of 300 $mJ/cm^2$ to 800 $mJ/cm^2$ inclusive. Note that the above-described range of energy density is an example in the case where a XeCl excimer laser (wavelength: 308 nm) is used as a pulsed laser.

Irradiation with the pulsed laser beam 132 is preferably performed in a vacuum or a reduced-pressure atmosphere. By performing the irradiation in a vacuum or a reduced-pressure atmosphere, heat conduction through a gas can be suppressed; accordingly, planarity of the surfaces of the single crystal semiconductor layers 120 can be further improved. In particular, influences of heat that the island-shaped semiconductor layers 120 have on each other are not small at all in the invention disclosed in this specification; therefore, pulsed laser irradiation in a vacuum or a reduced-pressure atmosphere is extremely effective. Note that a high vacuum is preferable in terms of suppressing heat conduction. For example, a vacuum of 50 Pa or lower (preferably, $5 \times 10^{-1}$ Pa or lower, more preferably $5 \times 10^{-3}$ Pa or lower) can be employed.

Instead of the vacuum or the reduced-pressure atmosphere, an inert atmosphere of nitrogen, argon, or the like can be employed as well. In the case of performing irradiation with the pulsed laser beam 132 in an inert atmosphere, the irradiation with the pulsed laser beam 132 may be performed in an airtight chamber while the atmosphere in the chamber is controlled. In the case where the chamber is not used, by blowing an inert gas such as a nitrogen gas to the surface which is irradiated with the pulsed laser beam 132, an inert atmosphere can be formed. In the case of employing an inert atmosphere such as nitrogen, planarity of the island-shaped semiconductor layers 120 is improved more than the case of employing an air atmosphere.

Here, the reason why the single crystal semiconductor layer 118 is divided into the island-shaped semiconductor layers 120 and then the island-shaped semiconductor layers 120 are irradiated with the pulsed laser beam 132 will be described with reference to FIGS. 3A to 3C and FIGS. 4A to 4C.

Figure 3A:
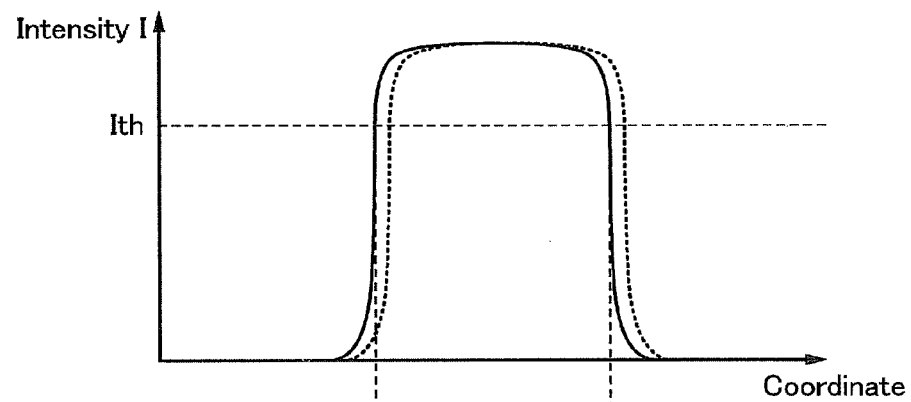
FIGS. 3A to 3C illustrate laser irradiation performed on a semiconductor layer.
Figure 3B:
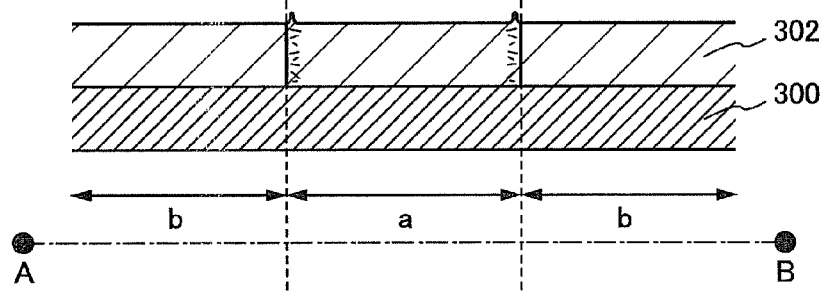
Figure 3C:
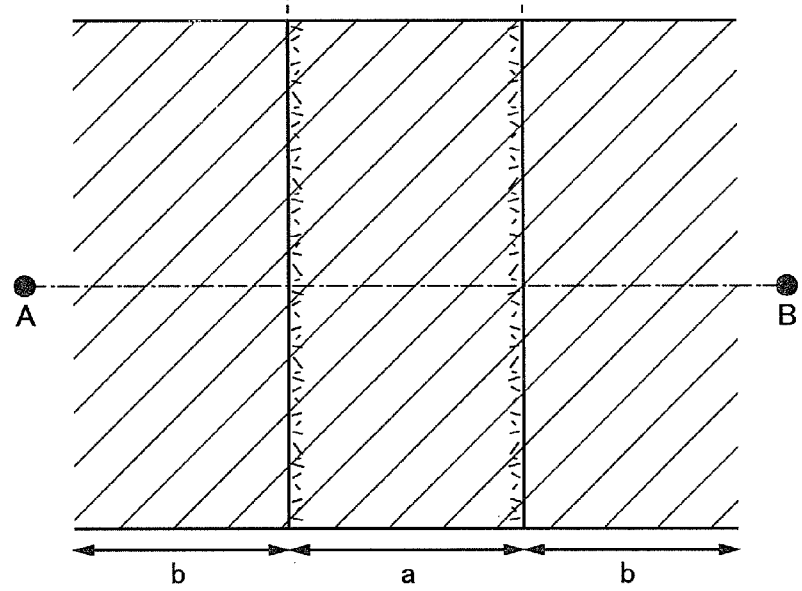

FIG. 3A illustrates a profile in a short axis direction of a rectangular pulsed laser beam (also referred to as a linear pulsed laser beam) which is often used in the case of forming a polycrystalline semiconductor layer or the like. FIGS. 3B and 3C illustrate the state of a single crystal semiconductor layer like the single crystal semiconductor layer 118 (a single crystal semiconductor layer which is not divided) after being irradiated with the above-described pulsed laser beam. Here, FIG. 3B corresponds to a cross section taken along the line A-B of FIG. 3C. Note that in FIGS. 3B and 3C, a single crystal semiconductor layer 302 is provided over an insulating layer 300.

By the research by the inventor of the invention disclosed in this specification, it is known that the irradiation intensity of a pulsed laser beam for reducing defects in a single crystal semiconductor layer is preferably set so as to make the single crystal semiconductor layer be in a partially-melted state or a state at or near a boundary between the partially-melted state and a completely-melted state (hereinafter referred to as an "initial completely-melted state"). This is because, when the single crystal semiconductor layer is made to be in a completely-melted state other than the "initial completely-melted state", there is a high possibility that the single crystal semiconductor layer may be microcrystallized due to disordered nucleation after being in a liquid state, so that the crystallinity of the single crystal semiconductor layer may become lower. Here in this case, the term "partially-melted state" means that the upper part of the single crystal semiconductor layer is melted and is in a liquid state while the lower part thereof is not melted and remains in a solid state. On the contrary, the term "completely-melted state" means that the single crystal semiconductor layer is melted down to an interface between the single crystal semiconductor layer and the lower insulating layer and is in a liquid state.

On the other hand, in the case of the partially-melted state, crystal growth proceeds from a solid region which is not melted; therefore, defects can be reduced while maintaining the crystallinity. In the case of the "initial completely-melted state", due to diffusion of heat to a lower part, solidification proceeds from a region around the interface between the single crystal semiconductor layer and the lower insulating layer and single crystallization can again proceed using this solidified region as a seed crystal. In the "initial completely-melted state", atoms are not arranged in a completely random order, and the atom arrangement in the region around the interface with the lower insulating layer, where increase in temperature is small, is not different from that of a single crystal semiconductor layer in a solid state. Therefore, solidification from the region around the interface with the lower insulating layer can reduce defects without reduction in crystallinity. Further, there is also a possibility that a small amount of solid which is not melted remains in the region around the interface with the lower insulating layer and crystal growth proceeds using this solid as a seed crystal.

FIG. 3A illustrates a profile of a pulsed laser beam. Here, $I_{th}$ represents a threshold intensity at which the melted state of the single crystal semiconductor layer 302 (see FIGS. 3B and 3C) changes. Specifically, if the intensity is lower than the threshold value $I_{th}$, the single crystal semiconductor layer 302 is in an unmelted state, and if the intensity is equal to or higher than the threshold value $I_{th}$, the single crystal semiconductor layer 302 is in a partially-melted state. That is, by irradiation with a pulsed laser beam having the profile shown by a solid line in FIG. 3A, at least a portion around a surface of a region a in the single crystal semiconductor layer 302 illustrated in FIGS. 3B and 3C becomes in a liquid state. In contrast, a region b in the single crystal semiconductor layer is kept in a solid state.

Thus, in the case where a "boundary between the solid state and the liquid state" exists, distortion is likely to be generated around the boundary. In other words, unevenness is likely to be generated on the surface of the single crystal semiconductor layer 302 around the boundary. As a method of reducing such surface unevenness, a method in which irradiation with pulsed laser beams is performed while shifting an irradiation region little by little can be given, for example.

Here, the case where irradiation with pulsed laser beams is performed while shifting an irradiation region little by little will be considered. In FIG. 3A, the profile shown by the solid line is of a pulsed laser beam which is emitted at a certain point of time (hereinafter referred to as a first pulsed laser beam), and the profile shown by the dotted line is of a pulsed laser beam which is emitted right after the irradiation with the first pulsed laser beam (hereinafter referred to as a second pulsed laser beam).

In the case where the irradiation region is slightly shifted after irradiation with the first pulsed laser beam and then irradiation with the second pulsed laser beam is performed as in the case of FIG. 3A, the "boundary between the solid state and the liquid state" caused by the irradiation with the first pulsed laser beam and the "boundary between the solid state and the liquid state" caused by the irradiation with the second pulsed laser beam are formed at slightly different places from each other, whereby regions in which surface unevenness is formed are also formed at slightly different places from each other. The intensity of the second pulsed laser beam which is emitted to the region, in which surface unevenness is formed by the irradiation with the first pulsed laser beam, is higher or lower than the intensity of the first pulsed laser beam by which the surface unevenness is formed.

That is, in this case, the region in which surface unevenness is formed by the first pulsed laser beam is irradiated with the second pulsed laser beam having such an intensity that surface unevenness is not formed. By utilizing this, surface unevenness formed by the first pulsed laser beam can be reduced.

However, in the case of reducing surface unevenness by such a method, it is necessary that a part of the second pulsed laser beam, with which a target region is irradiated, have such a beam intensity as to reduce surface unevenness formed by the first pulsed laser beam. Accordingly, the overlap amount (overlap rate) of the first pulsed laser beam and the second pulsed laser beam is naturally limited. That is, the overlap amount needs to be equal to or more than a certain amount in irradiation with the pulsed laser beams, which causes a problem in throughput.

Moreover, the surface unevenness formed by the first pulsed laser beam is not always planarized completely by the second pulsed laser beam. In particular, it is difficult to sufficiently reduce surface unevenness in a situation that irradiation with the second pulsed laser beam having an intensity lower than that in forming the surface unevenness is performed.

Figure 4A:
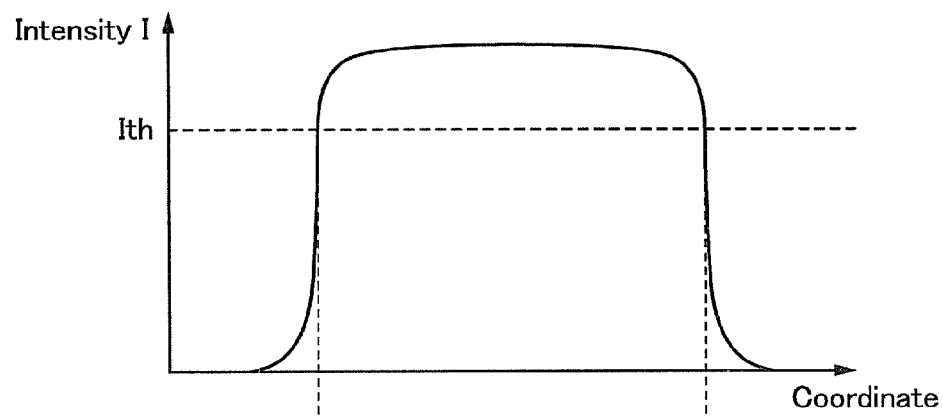
FIGS. 4A to 4C illustrate laser irradiation performed on an island-shaped semiconductor layer.
Figure 4B:
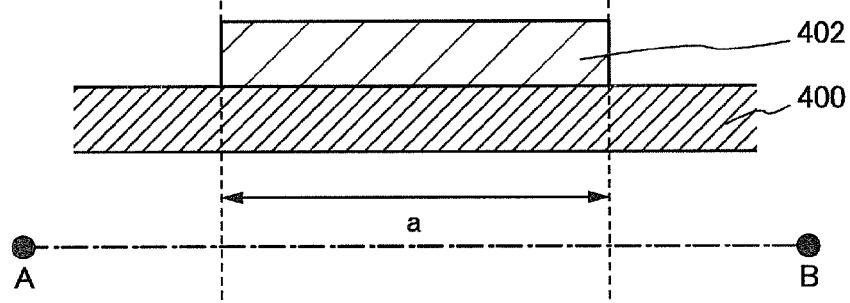
Figure 4C:
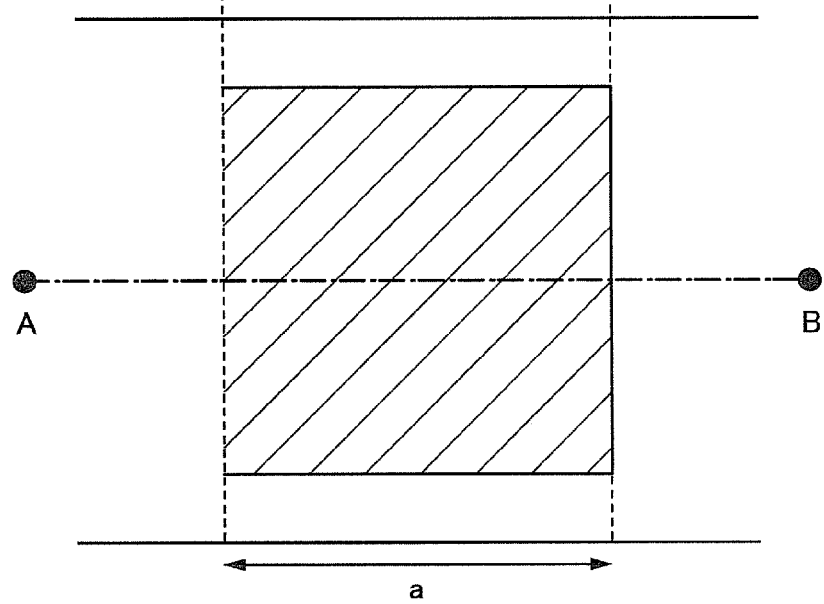

Next, the case illustrated in FIGS. 4A to 4C will be considered. FIGS. 4A to 4C illustrate the case where a single crystal semiconductor layer formed over an insulating layer 400 is divided into island shapes and a divided island-shaped semiconductor layer 402 is irradiated with a pulsed laser beam. The pulsed laser beam used at this time has a profile corresponding to the shape of the island-shaped semiconductor layer 402 (see FIG. 4A). Specifically, a pulsed laser beam is shaped so as not to generate a "boundary between a solid state and a liquid state" in the island-shaped semiconductor layer 402. FIG. 4A illustrates the case where a single crystal semiconductor layer is divided to form the island-shaped semiconductor layer 402 having a rectangular shape and the entire surface of the rectangular island-shaped semiconductor layer 402 is irradiated with a pulsed laser beam having an intensity equal to or higher than the threshold value $I_{th}$. Although the shape of the island-shaped semiconductor layer 402 is rectangular here, the shape is not limited to this and can be optionally determined. For example, the shape may be circular, pentagonal, or hexagonal. If the shape of the island-shaped semiconductor layer 402 is changed, the profile of the pulsed laser beam is also preferably changed in accordance with the shape of the island-shaped semiconductor layer.

As described above, the entire surface of the island-shaped semiconductor layer 402 is irradiated with a pulsed laser beam having an intensity equal to or higher than the threshold value $I_{th}$. Thus, laser processing can be performed so as not to generate a "boundary between a solid state and a liquid state." Accordingly, unevenness is not formed on the surface of the single crystal semiconductor layer; therefore, irradiation with many pulsed laser beams is not needed and throughput of pulsed laser processing is significantly improved. Note that since the "boundary between the solid state and the liquid state" is generated by irradiation with an edge portion of a pulsed laser beam, the expression "to irradiate an object with a pulsed laser beam so as not to generate a boundary between a solid state and a liquid state" can be replaced by the expression "not to irradiate an object with an edge portion of a pulsed laser beam" or the expression "to irradiate an object with a center portion of a pulsed laser beam."

After the irradiation with the pulsed laser beam 132 as described above, a thinning step in which the thicknesses of the island-shaped semiconductor layers 122 are reduced may be performed as well. In order to thin the island-shaped semiconductor layers 122, one of dry etching and wet etching or a combination of both of the etchings may be employed (etch-back treatment). For example, in the case where the island-shaped semiconductor layers 122 are layers formed from a silicon material, the island-shaped semiconductor layers 122 can be thinned by dry etching treatment using $SF_6$ and $O_2$ as process gases. In the above-described manner, a semiconductor substrate 150 including thin island-shaped semiconductor layers 124 can be manufactured (see FIG. 2D).

Note that in this embodiment mode, an example is described in which etching treatment is performed after planarizing the surface by irradiation with the pulsed laser beam; however, the invention disclosed in this specification should not be construed as being limited thereto. For example, etching treatment may be performed before irradiation with the pulsed laser beam. In this case, the unevenness or the defects of the surface of the semiconductor layer can be reduced to some extent by the etching treatment. Alternatively, the above treatment may be performed before and after the irradiation with the pulsed laser beam. Further alternatively, the irradiation with the pulsed laser beam and the above etching treatment may be alternately repeated. By using the irradiation with the pulsed laser beam and the etching treatment in combination as just described, unevenness, defects, and the like of the surface of the semiconductor layer can be significantly reduced.

Further, before or after irradiation with the pulsed laser beam 132, heat treatment may be performed at a temperature of equal to or lower than the allowable temperature limit of the base substrate 100. In addition to or instead of the above etching treatment or the heat treatment, planarization treatment such as chemical mechanical polishing (CMP) may be performed.

In this embodiment mode, a process in which a single crystal semiconductor layer is formed over a base substrate and then is patterned is described; however, the invention disclosed in this specification is not limited to this. For example, a single crystal semiconductor substrate may be patterned to form a recessed portion (groove portion) and this single crystal semiconductor substrate may be bonded to a base substrate to form a plurality of island-shaped semiconductor layers over the base substrate. In this case, a step of patterning the single crystal semiconductor substrate may be added between the step illustrated in FIG. 1C and the step illustrated in FIG. 1D. In this case, needless to say, the patterning step illustrated in FIG. 2A is not necessary.

The step of irradiating an island-shaped semiconductor layer with a pulsed laser beam described in this specification can be used for not only irradiation of a single crystal semiconductor but also irradiation of, for example, an amorphous semiconductor or a microcrystalline semiconductor with a pulsed laser beam. In this case, as described in this embodiment mode, after formation of the island-shaped semiconductor layer, the entire surface of the island-shaped semiconductor layer may be irradiated with a pulsed laser beam.

In the invention disclosed in this specification, a pulsed laser beam is shaped in accordance with the shape or the like of an island-shaped semiconductor layer. Alternatively, a semiconductor layer is patterned in accordance with an irradiation region of a pulsed laser beam. Accordingly, a semiconductor layer is not irradiated with an edge portion of a pulsed laser beam but is irradiated with a center portion of a pulsed laser beam, whereby surface unevenness caused by irradiation with the edge portion of the pulsed laser beam (i.e., a portion capable of producing a "boundary between a solid state and a liquid state") can be suppressed and a semiconductor substrate including a highly planar semiconductor layer can be provided. In addition, since irradiation with many pulsed laser beams for suppressing the surface unevenness is not needed, efficiency in manufacturing a semiconductor substrate can be improved.

Embodiment Mode 2

Figure 5A:
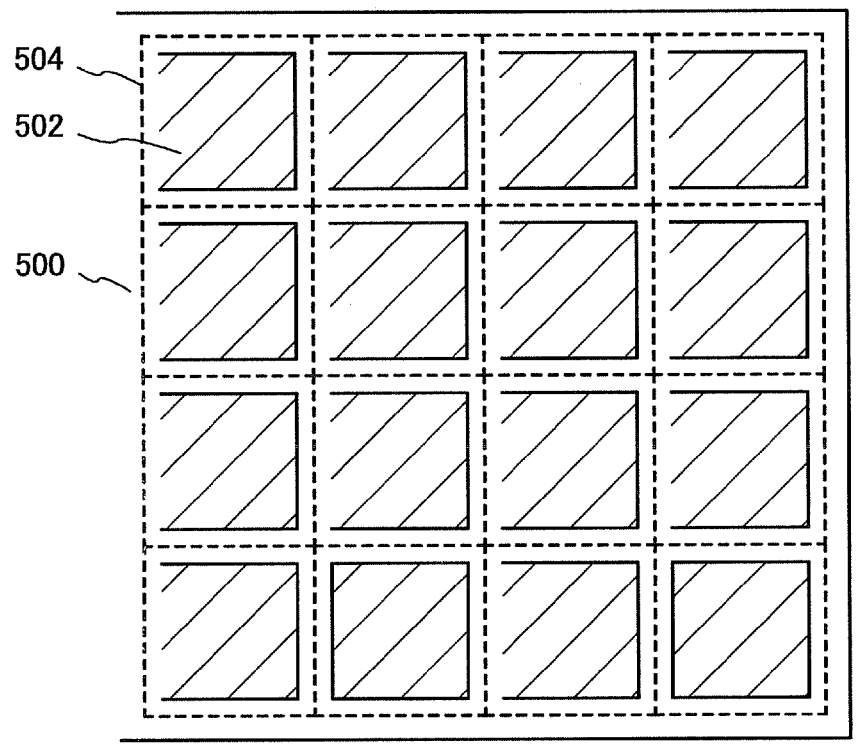
FIGS. 5A and 5B each illustrate a relationship between island-semiconductor layers and irradiation regions of pulsed laser beams.
Figure 5B:
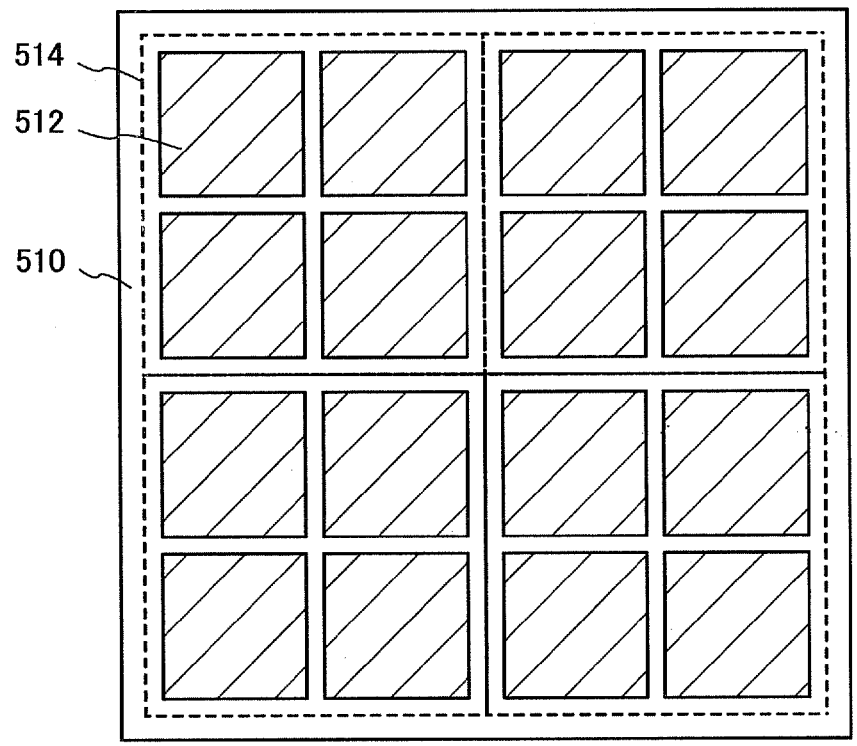

In Embodiment Mode 2, the relationship between the island-shaped semiconductor layers and the irradiation regions of pulsed laser beams in the manufacturing method of a semiconductor substrate described in Embodiment Mode 1 will be described with reference to FIGS. 5A and 5B. FIGS. 5A and 5B each illustrate a mode where rectangular semiconductor layers and rectangular pulsed laser beams (planar pulsed laser beams) are used; however, the invention disclosed in this specification is not limited to this.

FIG. 5A illustrates a mode where one island-shaped semiconductor layer 502 formed over a base substrate 500 is irradiated with one pulsed laser beam. Here, the irradiation region of the pulsed laser beam is shown by a region 504 (the region shown by a broken line in FIG. 5A). Note that the irradiation region of the pulsed laser beam means a region irradiated with a pulsed laser beam having an intensity equal to or higher than the threshold value $I_{th}$ in Embodiment Mode 1. Here, the intensity of the pulsed laser beam on the broken line in FIG. 5A is $I_{th}$.

Arrangement of the island-shaped semiconductor layers 502 (the size of the island-shaped semiconductor layers 502, the distance between the island-shaped semiconductor layers 502, and the like) is not particularly limited; however, it is at least required that the arrangement be such that the island-shaped semiconductor layers 502 are not irradiated with a portion which produces surface unevenness (i.e., the portion near the broken line) in irradiation with a pulsed laser beam. As an example of such arrangement of the island-shaped semiconductor layers 502, an arrangement in which a distance between the island-shaped semiconductor layers 502 is equal to or greater than 1 μm (preferably equal to or greater than 50 μm, more preferably equal to or greater than 200 μm) can be given. Note that FIG. 5A illustrates the mode where the island-shaped semiconductor layers 502 each have a square shape having a side of 1 mm and each irradiation region of a pulsed laser beam has a square shape having a side of 1.2 mm; however, the invention disclosed in this specification is not limited to this mode.

FIG. 5B illustrates a mode where four island-shaped semiconductor layers 512 formed over a base substrate 510 are irradiated with one pulsed laser beam. Here, the irradiation region of the pulsed laser beam is shown by a region 514 (the region shown by a broken line in FIG. 5B). Note that the definition of the "irradiation region" is the same as that in FIG. 5A.

In the case where a semiconductor layer is divided into portions having an element size in advance and then irradiated with pulsed laser beams, the structure illustrated in FIG. 5B can also be used. In this case, the distance between the four island-shaped semiconductor layers 512 in the region irradiated with one pulsed laser beam may be small enough. For example, the distance can be approximately 1 μm. Note that FIG. 5B illustrates the case where the island-shaped semiconductor layers 512 each have a square shape having a side of 0.55 mm and each irradiation region of a pulsed laser beam has a square shape having a side of 1.2 mm; however, the invention disclosed in this specification is not limited to this.

This embodiment mode can be implemented in combination with Embodiment Mode 1 as appropriate.

Embodiment Mode 3

In Embodiment Mode 3, an evaluation method which can be used for a manufacturing method of a semiconductor substrate will be described with reference to FIGS. 6A and 6B, FIGS. 7A and 7B, FIGS. 8A and 8B, and FIGS. 9A and 9B. First, an evaluation method of a semiconductor layer utilizing change in reflectance of a reference beam, with which a semiconductor layer is irradiated, depending on the melted state of the semiconductor layer and this nature, will be described with reference to FIGS. 6A and 6B and FIGS. 7A and 7B. In description with reference to FIGS. 6A and 6B and FIGS. 7A and 7B, the case where only the irradiation intensity of a pulsed laser beam is changed with a fixed irradiation time (pulse width) and a fixed irradiation pulse number will be described for simplicity.

Figure 6A:
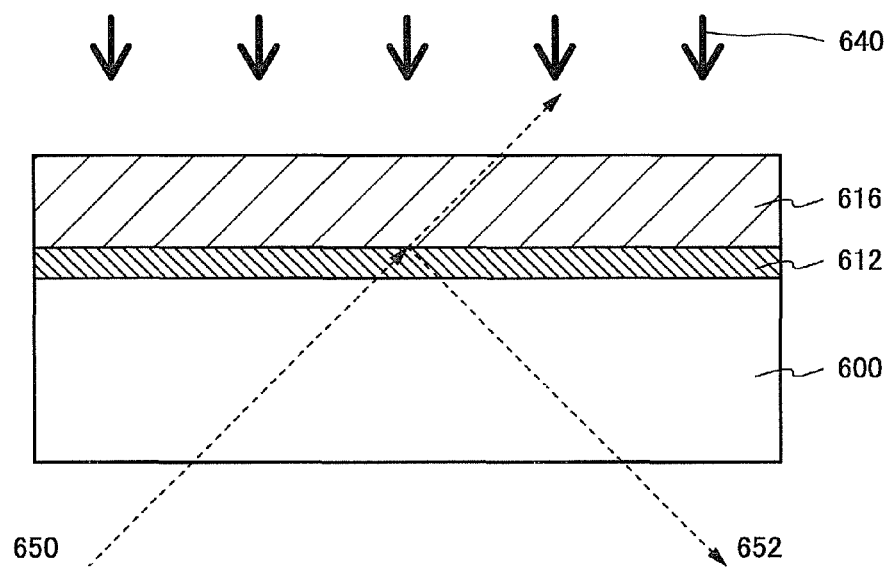
FIGS. 6A and 6B illustrate the principle of an evaluation method.
Figure 6B:
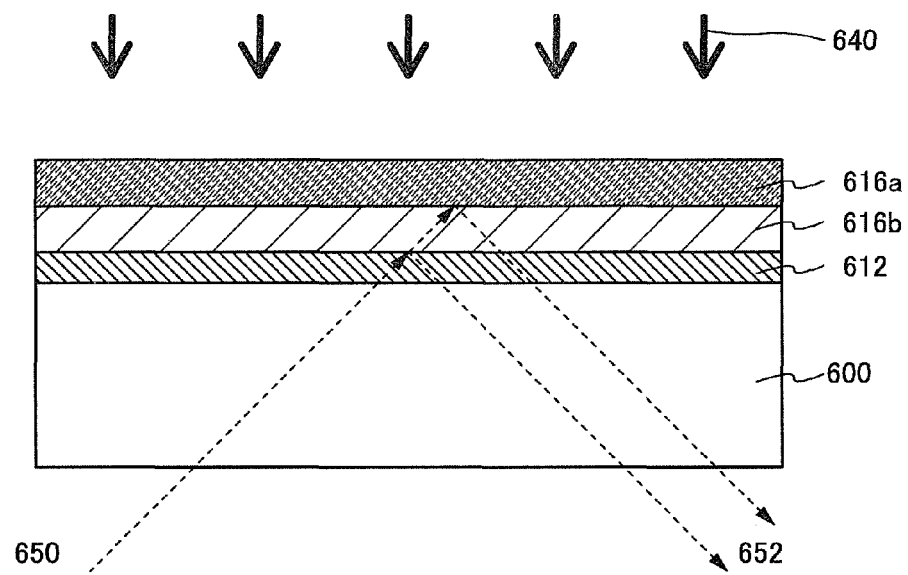

In FIGS. 6A and 6B, a semiconductor layer 616 is formed over an insulating layer 612 and the insulating layer 612 is formed over a base substrate 600. Note that the semiconductor layer 616 is irradiated from above with a pulsed laser beam 640 for melting the semiconductor layer 616.

Irradiation with a reference beam 650 is performed from a side opposite to the side of the surface irradiated with the pulsed laser beam 640, that is, from below (rear side) in the drawing. Here, since the reference beam 650 is used to judge the melted state of the semiconductor layer 616, at least a part of the reference beam 650 needs to reach the semiconductor layer 616. That is, the reference beam 650 has such a wavelength as to pass through the base substrate 600 and the insulating layer 612. Specifically, for example, in the case of using a glass substrate as a base substrate, a beam having a wavelength equal to or greater than 200 μm is preferably used. Note that in this embodiment mode, the case where irradiation with the reference beam 650 is performed from the rear side is described; however, the irradiation may also be performed from the front side.

FIG. 6A illustrates the case where the irradiation intensity of the pulsed laser beam 640 is low and the semiconductor layer 616 is in an unmelted state. Upon irradiation with the reference beam 650 from below in the drawing, a part of the reference beam 650 passes through the semiconductor layer 616 and the other is reflected at an interface with the semiconductor layer 616 or the like as a reflected beam 652. Then, the reflectance can be calculated from the ratio between the intensity of the reference beam 650 and the intensity of the reflected beam 652. In FIG. 6A, only the reflection at the interface between the semiconductor layer 616 and the insulating layer 612 is illustrated for simplicity; however, the actual reflected beam includes reflected beams which are reflected at other interfaces or the like.

FIG. 6B illustrates the case where the irradiation intensity of the pulsed laser beam 640 is relatively high and part of the semiconductor layer 616 is in a melted state (the case where the semiconductor layer 616 is in a partially-melted state). In this case, most part of the reference beam 650 is reflected at the interface between a semiconductor layer 616a in a melted state and a solid (unmelted) semiconductor layer 616b; accordingly, the intensity of the reflected beam 652 (reflectance) becomes higher than that of the case of FIG. 6A.

Here, in the case where a wavelength of the reference beam 650 is selected so that the reference beam 650 is absorbed by the solid semiconductor layer 616b to a certain degree, the intensity of the reflected beam 652 changes depending on the thickness of the solid semiconductor layer 616b. For example, in the case where the semiconductor layer 616a is very thin (in the case where only a small portion of the surface of the semiconductor layer 616 is melted), the amount of the reference beam 650 absorbed by the semiconductor layer 616b is larger and the intensity of the reflected beam 652 is lower than the case where the semiconductor layer 616a is thick (in the case where most part of the semiconductor layer is melted). This means that the intensity of the reflected beam 652 changes depending on the melted state of the semiconductor layer 616.

By utilizing the above nature, the partially-melted state can be evaluated in detail. In this case, selection of the wavelength of the reference beam 650 is a problem. However, since it is acceptable as long as the reference beam 650 has such a wavelength that at least part of the reference beam 650 is absorbed by the semiconductor layer 616b, a wavelength of 800 nm or less can be selected, for example, in the case of using a single crystal silicon semiconductor layer as a semiconductor layer. The lower limit of the wavelength may be determined in consideration of the penetration length of the beam and the thickness of the semiconductor layer. For example, if the thickness of the semiconductor layer 616 is about 100 nm, a wavelength having at least 300 nm or greater is preferably selected. In addition, since the melted state is evaluated using the reference beam 650, it is important that the intensity of the reference beam 650 be in such a level as not to greatly influence the melted state (as not to practically change the melted state).

Figure 7A:
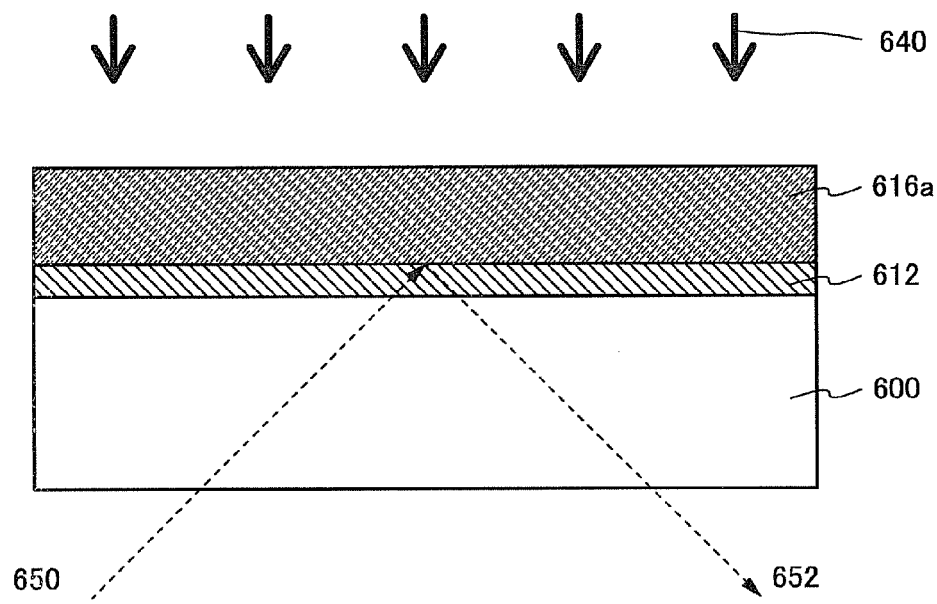
FIGS. 7A and 7B illustrate the principle of an evaluation method and an example of evaluation method.

FIG. 7A illustrates the case where the irradiation intensity of the pulsed laser beam 640 is sufficiently high and the semiconductor layer 616 is entirely melted (the case where the semiconductor layer 616 is in a completely-melted state). In this case, since an unmelted semiconductor layer (solid semiconductor layer) which absorbs the reference beam 650 does not exist unlike the case of FIG. 6B, the intensity of the reflected beam 652 is higher than those of the cases of FIGS. 6A and 6B. Note that in this state, even when the irradiation intensity of the pulsed laser beam 640 changes, it is regarded that the change in the intensity of the reflected beam 652 is extremely small.

Figure 7B:
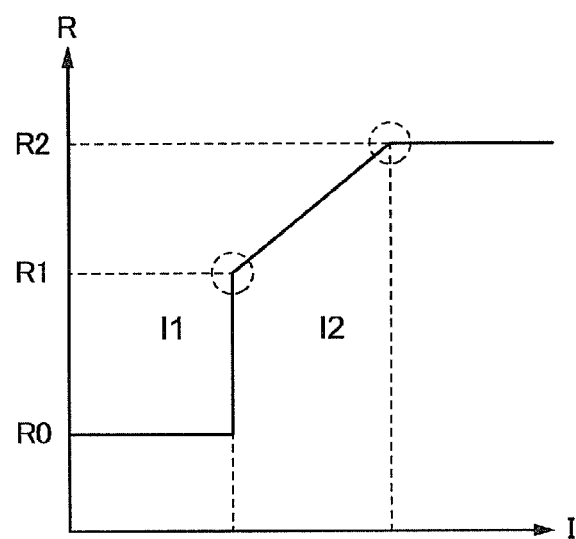

FIG. 7B schematically illustrates the relationship between the irradiation intensity of the pulsed laser beam 640 and the reflectance calculated from the reference beam 650 and the reflected beam 652. Here, the horizontal axis of the graph indicates the irradiation intensity I of the pulsed laser beam 640 and the vertical axis indicates the reflectance R. As described above, in the case where the irradiation intensity of the pulsed laser beam 640 is low, the semiconductor layer 616 is in an unmelted state; accordingly, the reflectance is lower (reflectance: R0) than the other states. Note that in the unmelted state, the reflectance is substantially constant regardless of the irradiation intensity of the pulsed laser beam 640.

When the irradiation intensity of the pulsed laser beam 640 is gradually increased and reaches the value represented by I1, the surface of the semiconductor layer 616 is melted. At this time, reflection occurs at a surface (interface) of the semiconductor layer 616a in a melted state, thereby rapidly increasing the reflectance (reflectance: R1). Further, when the irradiation intensity of the pulsed laser beam 640 is increased, the melted region becomes larger and the unmelted region becomes smaller in the semiconductor layer 616; accordingly, the reflectance increases depending on the irradiation intensity of the pulsed laser beam 640. Then, when the irradiation intensity of the pulsed laser beam 640 is further increased, the reflectance reaches a saturation point at the value represented by I2.

The summary of the above is as follows.
Irradiation with a reference beam is performed from the side opposite to the side of the surface of the semiconductor layer, which is irradiated with a pulsed laser beam, and the reflectance of the reference beam is observed.

The first reflectance (R1) and the second reflectance (R2) are used as references.

The first reflectance (R1) is a reflectance at an irradiation intensity at which the reflectance is rapidly increased in the graph illustrating the relationship between the irradiation intensity of the pulsed laser beam and the reflectance, that is, a reflectance in the case where only the surface of the semiconductor layer is melted.

The second reflectance (R2) is a reflectance at a saturation point in the graph illustrating the relationship between the irradiation intensity of a pulsed laser beam and the reflectance, that is, a reflectance in the case where almost all of the semiconductor layer (from the surface to the rear surface) is melted.

When the reflectance is lower than the first reflectance, it is judged that the semiconductor layer is in an unmelted state.

When the reflectance is equal to or higher than the first reflectance and lower than the second reflectance, it is judged that the semiconductor layer is in a partially-melted state.

When the reflectance is equal to or higher than the second reflectance, it is judged that the semiconductor layer is in a completely-melted state.

Thus, the melted state of the semiconductor layer can be evaluated from observation of the reflectance. Since only the reflectance needs to be observed in the structure of this embodiment mode, the melted state of the semiconductor layer can be evaluated very easily.

Next, an evaluation method of the melted state in the case of melting a semiconductor layer by pulsed laser beams will be described with reference to FIGS. 8A and 8B. Note that for convenience of description, the situation where the repetition rate of pulsed laser beams is so high that cooling of the semiconductor layer between irradiation moments of the pulsed laser beams can be practically ignored will be assumed and described.

Figure 8A:
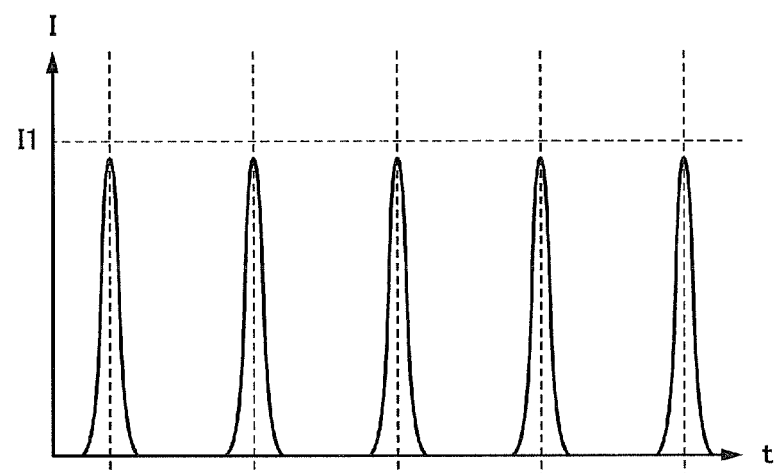
FIGS. 8A and 8B illustrate an example of an evaluation method.

FIG. 8A illustrates a relationship between intensities of pulsed laser beams and time. FIG. 8B illustrates a relationship between reflectance of a reference beam and time. The time axis of FIG. 8A and the time axis of FIG. 8B correspond to each other, and there are intensity peaks of the pulsed laser beams at time t1, time t2, time t3, time t4, and time t5.

Figure 8B:
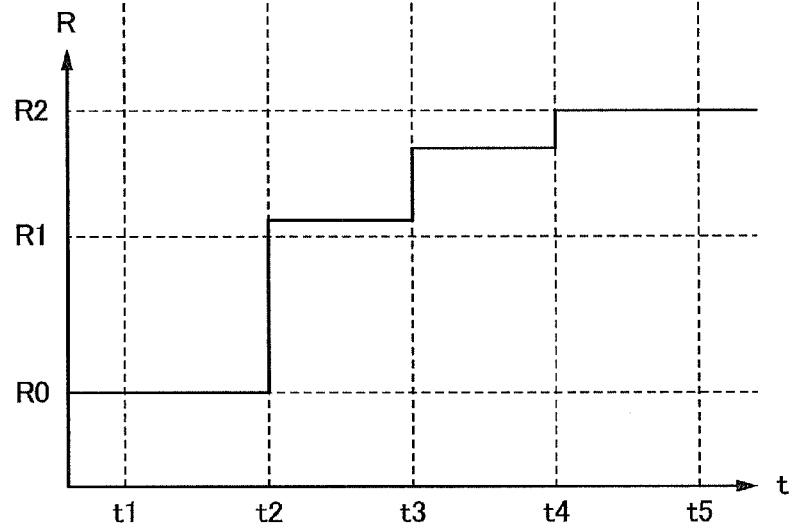

In FIGS. 8A and 8B, the intensity of each pulse is slightly lower than the intensity I1 at which partial melting is caused. At the time t1 when irradiation with the first pulse is performed, the semiconductor layer is not melted. Therefore, the reflectance does not change from R0 at the time t1. Then, at the time t2 when irradiation with the second pulse is performed, the semiconductor layer is melted (partially melted), so that the reflectance exceeds R1. Then, at the time t3 when irradiation with the third pulse is performed, melting further proceeds and the remaining unmelted part of the semiconductor layer decreases.

At the time t4 when irradiation with the fourth pulse is performed, the semiconductor layer is completely melted and the reflectance reaches R2. After that, at the time t5 when irradiation with the fifth pulse is performed, the reflectance has reached a saturation point and the reflectance does not change from R2. Here, a change in the reflectance due to cooling (solidification) is not described. However, these are only schematic views and the reflectance practically changes due to cooling.

Note that the intensities of the pulsed laser beams are slightly lower than I1 in FIG. 8A; however, this is only for convenience of description and the intensities of the pulsed laser beams may be arbitrary. For example, there is no problem if the intensities of the pulsed laser beams are equal to or higher than I1. The intensity of the pulsed laser beams can be set as appropriate in accordance with the purposes.

The summary of the above is as follows.
Irradiation with a reference beam is performed from the side opposite to the side of the surface of the semiconductor layer, which is irradiated with a pulsed laser beam, and the change in the reflectance of the reference beam over time is observed.
The phase where the reflectance is not changed: It is judged that the semiconductor layer is in an unmelted state.
The phase where the reflectance is changed: It is judged that the semiconductor layer is in a partially-melted state.
The phase where the reflectance has reached a saturation point: It is judged that the semiconductor layer is in a completely-melted state.

In the case where the intensity of a pulsed laser beam is set to be higher than I1, the semiconductor layer is partially melted by irradiation with the first pulse; therefore, the above-described "phase where the reflectance is not changed" does not exist. In addition, in the case where the intensity of a pulsed laser beam is set to be higher than I2, the semiconductor layer is completely melted by irradiation with the first pulse; therefore, the above-described "phase where the reflectance is not changed" and the "phase where the reflectance is changed" do not exist. Accordingly, the melted state of the semiconductor layer can be evaluated in consideration of theses cases.

Thus, the melted state of the semiconductor layer can be evaluated from observation of the reflectance. Since only the reflectance needs to be observed in the structure of this embodiment mode, the melted state of the semiconductor layer can be evaluated very easily.

Note that in reality, it is difficult to emit pulses with such a stable intensity as in FIG. 8A. Accordingly, it is preferable to control the irradiation pulse number, the irradiation time, the irradiation intensity, and the like as appropriate depending on whether the semiconductor layer is in a desired melted state during the irradiation with pulsed laser beams.

Next, another example of an evaluation method in the case of melting a semiconductor layer by pulsed laser beams will be described with reference to FIGS. 9A and 9B. Note that the situation where the repetition rate of pulsed laser beams is low and, therefore, the semiconductor layer heated by irradiation with one pulse is cooled before irradiation with the next pulse, that is, the situation where heat is not accumulated will be assumed and described.

Figure 9A:
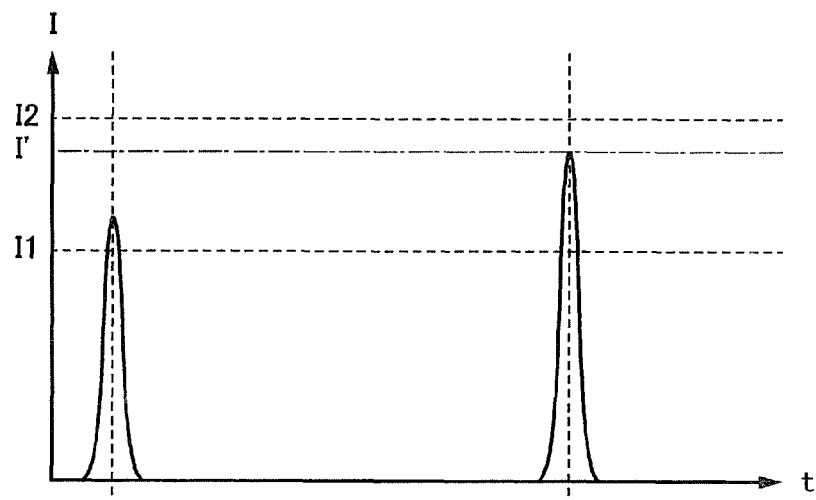
FIGS. 9A and 9B illustrate an example of an evaluation method.

FIG. 9A illustrates the relationship between intensities of pulsed laser beams and time. FIG. 9B illustrates the relationship between reflectance of a reference beam and time. The time axis of FIG. 9A and the time axis of FIG. 9B correspond to each other, and there are intensity peaks of the pulsed laser beams at time t1' and time t2'.

In FIG. 9A, the objective intensity of the pulsed laser beam is represented by I'. As described above, it is difficult to stabilize the intensities of the pulsed laser beams in reality. Therefore, even in the case where the objective intensity I' of the pulsed laser beam is determined, the actual intensity of a pulsed laser beam may be larger or smaller than the objective intensity I' of the pulsed laser beam. For example, at the time t1', the actual intensity of the pulsed laser beam is lower than the objective intensity I' of the pulsed laser beam.

Thus, when the desired intensity is not obtained, it is understood that the semiconductor layer does not reach a desired melted state; and in this state, reduction in defects is not enough and characteristics of the semiconductor layer are poor. As an example for solving this problem, there is a method in which a semiconductor layer is irradiated with many pulsed laser beams so that the influence by the variation in the intensity between pulses is reduced. However, this method has a problem in throughput because even in the case where the desired melted state is obtained by the first pulse, irradiation with many pulsed laser beams is performed routinely. Furthermore, since many pulses may be wasted, this method is not preferable in terms of the life of a laser.

Here, in order to solve the aforementioned problems, the melted state of a semiconductor layer is evaluated. Specifically, whether a semiconductor layer reaches a desired melted state is evaluated every irradiation with a pulsed laser beam. Accordingly, whether irradiation treatment with a pulsed laser beam needs to be continued can be determined depending on the melted state of the semiconductor layer, whereby throughput can be improved. In addition, a laser can have a longer life.

The specific evaluation method is as follows.
First, an objective melted state is determined, and an "objective reflectance (R')" corresponding to the objective melted state is determined. In this decision, any of the above-described evaluation methods can be used.

Next, the change in reflectance over time when irradiation with pulsed laser beams is performed is measured. For example, in FIGS. 9A and 9B, the reflectance (maximum value) at the time t1' when irradiation with the first pulse is performed is lower than the objective reflectance (R'). In this case, it is judged that the desired melted state is not obtained. Then, the reflectance (maximum value) at the time t2' when irradiation with the second pulse is performed reaches the objective reflectance (R'); in this case, it is judged that the desired melted state is obtained. Note that in a certain range where the reflectance is equal to or higher than the objective reflectance (R'), it can be judged that the desired melted state is obtained. A specific example of the certain range is "equal to or higher than the objective reflectance (R') and equal to or lower than the second reflectance (R2)."

Figure 9B:
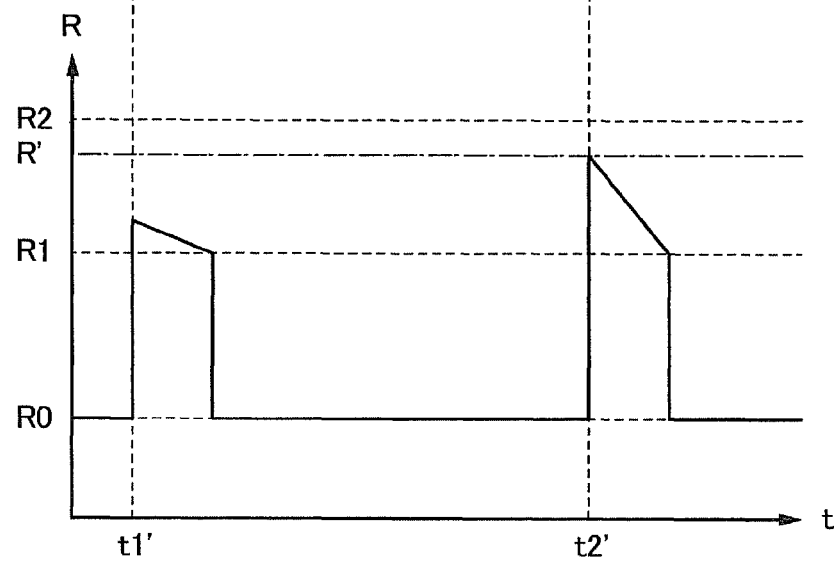

Although not illustrated in FIGS. 9A and 9B, in the case where the reflectance exceeds the above-described certain range, it can be judged that the semiconductor layer exceeds the desired melted state. For example, in the case where the certain range is "equal to or higher than the objective reflectance (R') and equal to or lower than the second reflectance (R2)" and a reflectance exceeds the certain range, it can be judged that the semiconductor layer exceeds the desired melted state. Note that in the situation where the reflectance exceeds the second reflectance (R2), microcrystallization progresses and the semiconductor layer becomes undesirable as a single crystal semiconductor.

The summary of the above is as follows.
Irradiation with a reference beam is performed from the side opposite to the side of the surface of the semiconductor layer, which is irradiated with a pulsed laser beam, and change in the reflectance of the reference beam over time is observed.
The objective reflectance (R') is used as a reference.
The objective reflectance (R') is a (maximum value of) reflectance in the case where irradiation with a pulsed laser beam having an objective intensity is performed.
When the maximum value of the reflectance is lower than the objective reflectance, it is judged that the semiconductor layer is not in the desire melted state.
When the maximum value of the reflectance is in a certain range which is equal to or higher than the objective reflectance, it is judged that the semiconductor layer has reached the desired melted state.

When the maximum value of the reflectance exceeds the certain range, it is judged that the semiconductor layer has reached the melted state which exceeds the desired melted state.

Note that in the case where it is judged that the semiconductor layer has reached the desired melted state, it can be considered that irradiation treatment with pulsed laser beams in the irradiation region is completed. Therefore, after that, the substrate or an optical system may be moved and irradiation with a pulsed laser beam may be performed on another region. Alternatively, in the case where the irradiation treatment with a pulsed laser beam is not necessary any more, emission of a pulsed laser beam may be stopped. In the case where it is judged that the semiconductor layer has reached the melted state exceeding the desired melted state, it is preferable that the region of the semiconductor layer, which has reached the melted state exceeding the desired melted state, is not used for a semiconductor element or the like. When there is a method by which the region can be recovered, the region can be recovered and used. As a recovering method, for example, a method in which irradiation with a pulsed laser beam is performed until the desired reflectance is obtained can be given.

Thus, the melted state of the semiconductor layer can be evaluated from observation of the reflectance. Since only the reflectance needs to be observed in the structure of this embodiment mode, the melted state of the semiconductor layer can be evaluated very easily. In addition, whether irradiation treatment with a pulsed laser beam needs to be continued can be determined depending on the evaluation of the semiconductor layer, whereby characteristics of the semiconductor layer can be improved and, at the same time, throughput can be improved. In addition, the life of a laser can be extended, which results in manufacture of a favorable semiconductor layer at low cost.

In this embodiment mode, several evaluation methods have been proposed for different purposes of evaluation and different irradiation conditions of pulsed laser beams; however, the evaluation method of a semiconductor layer is not limited to these. The above-described evaluation methods can be combined as appropriate.

This embodiment mode can be implemented in combination with Embodiment Mode 1 or 2 as appropriate.

Embodiment Mode 4

In Embodiment Mode 4, a manufacturing method of a semiconductor device using the above-described semiconductor substrate will be described with reference to FIGS. 10A to 10D, FIGS. 11A to 11D, and FIGS. 12A and 12B. Here, a manufacturing method of a semiconductor device including a plurality of transistors as an example of the semiconductor device is described. Note that various semiconductor devices can be formed with the use of transistors described below in combination.

Figure 10A:
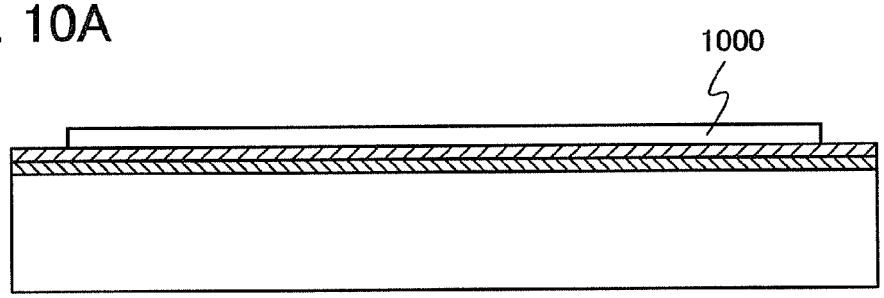
FIGS. 10A to 10D illustrate a manufacturing process of a semiconductor device.
Figure 10B:
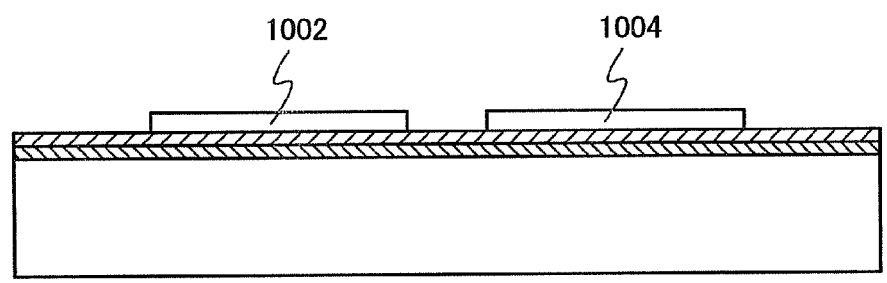

FIG. 10A is a cross-sectional view of a semiconductor substrate manufactured in Embodiment Mode 1. Note that in this embodiment mode, the case where the insulating layer 116 in Embodiment Mode 1 has a two-layer structure will be described.

For controlling the threshold voltages of TFTs, a p-type impurity element such as boron, aluminum, or gallium or an n-type impurity element such as phosphorus or arsenic may be added to a semiconductor layer 1000 (corresponding to the island-shaped semiconductor layer 124 in Embodiment Mode 1). A region to which the impurity element is added and the kind of the impurity element to be added can be changed as appropriate. For example, a p-type impurity element can be added to a formation region of an n-channel TFT, and an n-type impurity element can be added to a formation region of a p-channel TFT. The above impurity elements may be added at a dose of approximately equal to or higher than $1\times10^{15}/cm^2$ and equal to or lower than $1\times10^{17}/cm^2$. Then, the semiconductor layer 1000 is divided into island shapes to form a semiconductor layer 1002 and a semiconductor layer 1004 (see FIG. 10B).

Figure 10C:
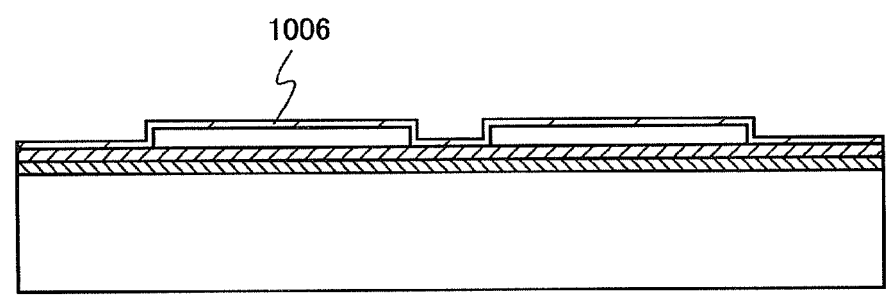

Next, a gate insulating layer 1006 is formed so as to cover the semiconductor layer 1002 and the semiconductor layer 1004 (see FIG. 10C). Here, a single-layer silicon oxide film is formed by a plasma CVD method. Alternatively, a film containing silicon oxynitride, silicon nitride oxide, silicon nitride, hafnium oxide, aluminum oxide, tantalum oxide, or the like may be formed with a single-layer structure or a stacked structure as the gate insulating layer 1006.

As a manufacturing method other than a plasma CVD method, a sputtering method or a method using oxidation or nitridation by high density plasma treatment can be given. High-density plasma treatment is performed using, for example, a mixed gas of a rare gas such as helium, argon, krypton, or xenon; and a gas such as oxygen, nitrogen oxide, ammonia, nitrogen, or hydrogen. In this case, by exciting plasma by introduction of microwaves, plasma with a low electron temperature and high density can be generated. The surfaces of the semiconductor layers are oxidized or nitrided by oxygen radicals (OH radicals may be included) or nitrogen radicals (NH radicals may be included) which are generated by such high-density plasma, whereby the insulating layer is formed to a thickness of equal to or greater than 1 nm and equal to or less than 20 nm, preferably equal to or greater than 2 nm and equal to or less than 10 nm so as to be in contact with the semiconductor layers.

Since the oxidation or nitridation of the semiconductor layers by the above-described high-density plasma treatment is a solid-phase reaction, the interface state density between the gate insulating layer 1006 and each of the semiconductor layer 1002 and the semiconductor layer 1004 can be drastically reduced. Further, the semiconductor layers are directly oxidized or nitrided by the high-density plasma treatment, whereby variation in the thickness of the insulating layer to be formed can be suppressed. Since the semiconductor layers have crystallinity, even when the surfaces of the semiconductor layers are oxidized by a solid-phase reaction by using the high-density plasma treatment, nonuniform oxidation at a crystal grain boundary can be suppressed; thus, a gate insulating layer with favorable uniformity and a low interface state density can be formed. When an insulating layer formed by high-density plasma treatment as described above is used for a part of or whole the gate insulating layer of a transistor, variation in characteristics can be suppressed.

A more specific example of the manufacturing method of the insulating layer by plasma treatment will be described. The surfaces of the semiconductor layer 1002 and the semiconductor layer 1004 are oxidized or nitrided in such a manner that dinitrogen monoxide ($N_2O$) is diluted with argon (Ar) by 1 to 3 times (flow rate) and a microwave (2.45 GHz) power of equal to or higher than 3 kW and equal to or lower than 5 kW is applied under a pressure of equal to or higher than 10 Pa and equal to or lower than 30 Pa. By this treatment, a lower layer of the gate insulating layer 1006 with a thickness of equal to or greater than 1 nm and equal to or less than 10 nm (preferably equal to or greater than 2 nm and equal to or less than 6 nm) is formed. Further, a silicon oxynitride film is formed as an upper layer of the gate insulating layer 1006 by a vapor-phase growth method in such a manner that dinitrogen monoxide ($N_2O$) and silane ($SiH_4$) are introduced and a microwave (2.45 GHz) power of equal to or higher than 3 kW and equal to or lower than 5 kW is applied under a pressure of equal to or higher than 10 Pa and equal to or lower than 30 Pa. The gate insulating layer 1006 is formed by combining solid phase reaction and reaction by a vapor-phase growth method as described above, whereby the gate insulating layer 1006 with a low interface state density and an excellent withstand voltage can be formed. Note that in this case, the gate insulating layer 1006 has a two-layer structure.

Alternatively, the gate insulating layer 1006 may be formed by thermally oxidizing the semiconductor layer 1002 and the semiconductor layer 1004. In the case of using such thermal oxidation, a base substrate with a relatively high heat resistance is preferably used.

Note that hydrogen contained in the gate insulating layer 1006 may be dispersed in the semiconductor layer 1002 and the semiconductor layer 1004 by performing heat treatment at a temperature of equal to or higher than 350° C. and equal to or lower than 450° C. after formation of the gate insulating layer 1006 containing hydrogen. In this case, the gate insulating layer 1006 may be formed by depositing silicon nitride or silicon nitride oxide by a plasma CVD method. Further, a process temperature is preferably set to be equal to or lower than 350° C. If hydrogen is supplied to the semiconductor layer 1002 and the semiconductor layer 1004 in this manner, defects in the semiconductor layer 1002, in the semiconductor layer 1004, at an interface between the gate insulating layer 1006 and the semiconductor layer 1002, and at an interface between the gate insulating layer 1006 and the semiconductor layer 1004 can be effectively reduced. Note that this treatment may be referred to as hydrogenation.

Figure 10D:
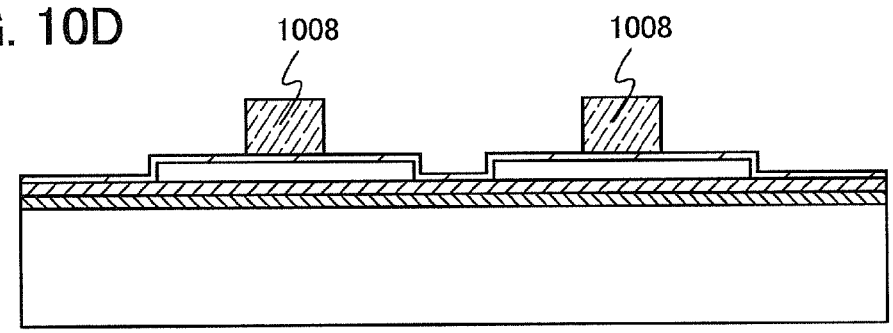

Next, a conductive layer is formed over the gate insulating layer 1006, and then the conductive layer is processed (patterned) into a predetermined shape, whereby electrodes 1008 are formed over the semiconductor layers 1002 and 1004 (see FIG. 10D). The conductive layer can be formed by a CVD method, a sputtering method, or the like. The conductive layer can be formed of a material such as tantalum (Ta), tungsten (W), titanium (Ti), molybdenum (Mo), aluminum (Al), copper (Cu), chromium (Cr), or niobium (Nb). Alternatively, an alloy material containing the above-described metal as a main component or a compound containing the above-described metal can also be used. Further alternatively, a semiconductor material such as polycrystalline silicon, which is obtained by doping a semiconductor film with an impurity element that imparts a conductivity type, or the like may be used.

Although the electrodes 1008 are formed using a single-layer conductive layer in this embodiment mode, the semiconductor device of the invention disclosed in this specification is not limited to the structure. Each of the electrodes 1008 may be formed of plural conductive layers which are stacked. In the case of a two-layer structure, for example, a molybdenum film, a titanium film, a titanium nitride film, or the like may be used as a lower layer, and an aluminum film or the like may be used as an upper layer. In the case of a three-layer structure, a stacked structure of a molybdenum film, an aluminum film, and a molybdenum film; a stacked structure of a titanium film, an aluminum film, and a titanium film; or the like may be used.

Note that a mask used for forming the electrodes 1008 may be formed using a material such as silicon oxide, silicon nitride oxide, or the like. In this case, a step of forming a mask by patterning a silicon oxide film, a silicon nitride oxide film, or the like is additionally needed; however, the amount of the reduced film thickness of the mask in etching is smaller than that in the case of using a resist material; thus, the electrodes 1008 with a precise shape can be formed. Alternatively, the electrodes 1008 may be selectively formed by a droplet discharge method without using the masks. Here, a droplet discharge method refers to a method in which droplets containing a predetermined composition are discharged or ejected to form a predetermined pattern, and includes an ink-jet method and the like in its category.

Alternatively, the electrodes 1008 can be formed by etching the conductive layer to have a desired tapered shape by an inductively coupled plasma (ICP) etching method with appropriate adjustment of the etching conditions (e.g., the amount of electric power applied to a coiled electrode layer, the amount of electric power applied to an electrode layer on the substrate side, the electrode temperature on the substrate side, and the like). The tapered shape can be adjusted according to the shape of the mask. Note that as an etching gas, a chlorine-based gas such as chlorine, boron chloride, silicon chloride, or carbon tetrachloride; a fluorine-based gas such as carbon tetrafluoride, sulfur fluoride, or nitrogen fluoride; oxygen; or the like can be used as appropriate.

Figure 11A:
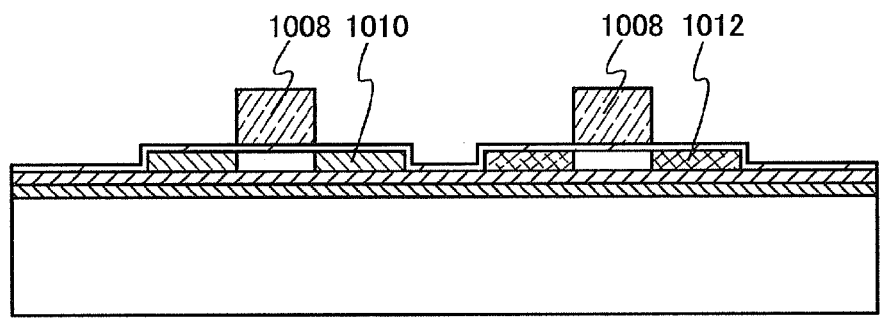
FIGS. 11A to 11D illustrate a manufacturing process of a semiconductor device.

Next, an impurity element imparting one conductivity type is added to the semiconductor layer 1002 and the semiconductor layer 1004 using the electrodes 1008 as masks (see FIG. 11A). In this embodiment mode, an impurity element imparting n-type conductivity (e.g., phosphorus or arsenic) is added to the semiconductor layer 1002, and an impurity element imparting p-type conductivity (e.g., boron) is added to the semiconductor layer 1004. Note that when the impurity element imparting n-type conductivity is added to the semiconductor layer 1002, the semiconductor layer 1004 to which the p-type impurity element is added is covered with a mask or the like so that the impurity element imparting n-type conductivity is added selectively. Further, when the impurity element imparting p-type conductivity is added to the semiconductor layer 1004, the semiconductor layer 1002 to which the impurity element imparting n-type conductivity is added is covered with a mask or the like so that the impurity element imparting p-type conductivity is added selectively. Alternatively, after the impurity element imparting one of p-type and n-type conductivities is added to the semiconductor layers 1002 and 1004, an impurity element imparting the other conductivity type may be added to only one of the semiconductor layers at a higher concentration. By the addition of the impurity elements, impurity regions 1010 and impurity regions 1012 are formed in the semiconductor layer 1002 and the semiconductor layer 1004, respectively.

Figure 11B:
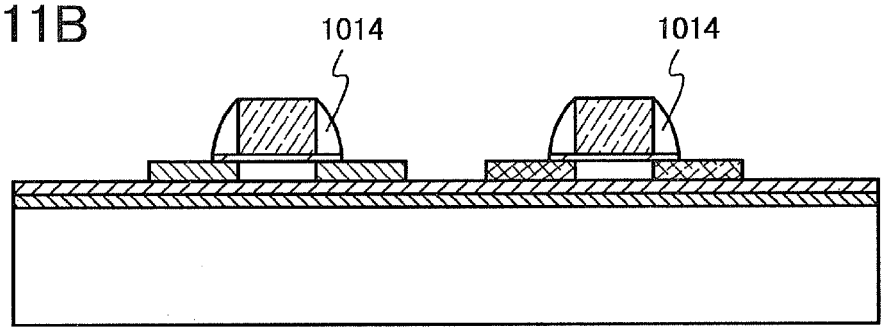

Next, sidewalls 1014 are formed on side surfaces of the electrodes 1008 (see FIG. 11B). The sidewalls 1014 can be formed by, for example, newly forming an insulating layer so as to cover the gate insulating layer 1006 and the electrodes 1008 and by partially etching the newly-formed insulating layer by anisotropic etching mainly in a perpendicular direction. Note that the gate insulating layer 1006 may also be etched partially by the anisotropic etching described above. For the insulating layer for forming the sidewalls 1014, a film containing silicon, silicon oxide, silicon nitride, silicon oxynitride, silicon nitride oxide, an organic material, or the like may be formed to have a single layer structure or a stacked structure by a plasma CVD method, a sputtering method, or the like. In this embodiment mode, a 100-nm-thick silicon oxide film is formed by a plasma CVD method. In addition, as an etching gas, a mixed gas of $CHF_3$ and helium can be used. Note that the steps of forming the sidewalls 1014 are not limited to the steps described here.

Figure 11C:
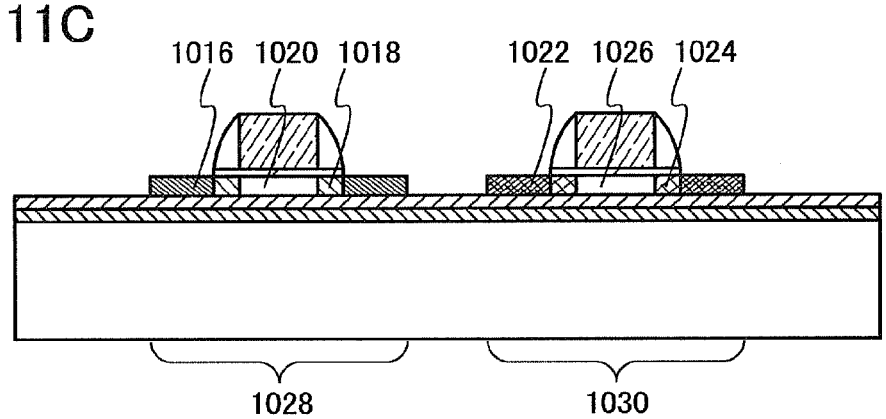

Next, impurity elements each imparting one conductivity type are added to the semiconductor layer 1002 and the semiconductor layer 1004 using the gate insulating layer 1006, the electrodes 1008, and the sidewalls 1014 as masks (see FIG. 11C). Note that the impurity element imparting the same conductivity type as the impurity element which has been added to each of the semiconductor layer 1002 and the semiconductor layer 1004 is added at a higher concentration. Note that when the impurity element imparting n-type conductivity is added to the semiconductor layer 1002, the semiconductor layer 1004 to which the p-type impurity element is added is covered with a mask or the like so that the impurity element imparting n-type conductivity is added selectively. Further, when the impurity element imparting p-type conductivity is added to the semiconductor layer 1004, the semiconductor layer 1002 to which the impurity element imparting n-type conductivity is added is covered with a mask or the like so that the impurity element imparting p-type conductivity is added selectively.

By the addition of the impurity element, a pair of high-concentration impurity regions 1016, a pair of low-concentration impurity regions 1018, and a channel formation region 1020 are formed in the semiconductor layer 1002. In addition, by the addition of the impurity element, a pair of high-concentration impurity regions 1022, a pair of low-concentration impurity regions 1024, and a channel formation region 1026 are formed in the semiconductor layer 1004. The high-concentration impurity regions 1016 and the high-concentration impurity regions 1022 each function as a source or a drain, and the low-concentration impurity regions 1018 and the low-concentration impurity regions 1024 each function as an LDD (lightly doped drain) region.

Note that the sidewalls 1014 formed over the semiconductor layer 1002 and the sidewalls 1014 formed over the semiconductor layer 1004 may be formed so as to have the same width or different widths in a direction in which carriers move (that is, a direction parallel to a channel length). The length of each of the sidewalls 1014 over the semiconductor layer 1004 which constitutes part of a p-channel transistor may be larger than the length of each of the sidewalls 1014 over the semiconductor layer 1002 which constitutes part of an n-channel transistor. This is because boron which is added for forming a source and a drain in the p-channel transistor is easily diffused and a short channel effect is easily induced. By increasing the lengths of the sidewalls 1014 of the p-channel transistor, boron can be added to the source and the drain at high concentration, whereby the resistance of the source and the drain can be reduced.

In order to further reduce the resistance of the source and the drain, a silicide layer may be formed by forming silicide in part of the semiconductor layers 1002 and 1004. The silicide is formed by placing a metal in contact with the semiconductor layers and causing a reaction between the metal and silicon in the semiconductor layers by heat treatment (e.g., a GRTA method, an LRTA method, or the like). For the silicide layer, cobalt silicide or nickel silicide may be used. In the case where the semiconductor layers 1002 and 1004 are thin, silicide reaction may proceed to bottoms of the semiconductor layers 1002 and 1004. As a metal material used for the siliciding, the following can be used: titanium (Ti), nickel (Ni), tungsten (W), molybdenum (Mo), cobalt (Co), zirconium (Zr), hafnium (Hf), tantalum (Ta), vanadium (V), neodymium (Nd), chromium (Cr), platinum (Pt), palladium (Pd), or the like. Further, a silicide layer can also be formed by laser irradiation or the like.

Through the aforementioned process, an n-channel transistor 1028 and a p-channel transistor 1030 are formed. Note that although conductive layers each serving as a source electrode or a drain electrode have not been formed in the stage shown in FIG. 11C, a structure including these conductive layers each serving as a source electrode or a drain electrode may also be referred to as a transistor.

Figure 11D:
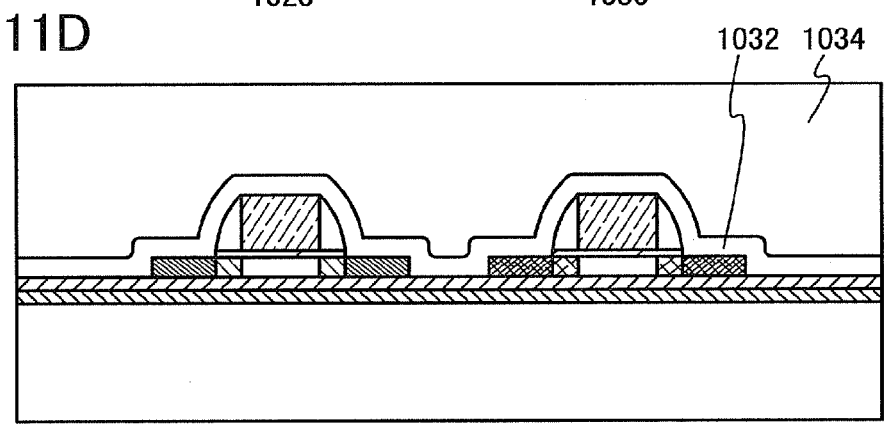

Next, an insulating layer 1032 is formed to cover the n-channel transistor 1028 and the p-channel transistor 1030 (see FIG. 11D). The insulating layer 1032 is not always necessary; however, the formation of the insulating layer 1032 can prevent impurities such as an alkali metal and an alkaline-earth metal from penetrating the n-channel transistor 1028 and the p-channel transistor 1030. Specifically, the insulating layer 1032 is preferably formed using a material such as silicon oxide, silicon nitride, silicon oxynitride, silicon nitride oxide, aluminum nitride, aluminum oxide, or the like. In this embodiment mode, a silicon nitride oxide film with a thickness of approximately 600 nm is used as the insulating layer 1032. In this case, the above-described hydrogenation step may be performed after the silicon nitride oxide film is formed. Note that although the insulating layer 1032 is formed to have a single-layer structure in this embodiment mode, it is needless to say that the insulating layer 1032 may have a stacked structure. For example, in the case of a two-layer structure, the insulating layer 1032 may have a stacked structure of a silicon oxynitride film and a silicon nitride oxide film.

Next, an insulating layer 1034 is formed over the insulating layer 1032 so as to cover the n-channel transistor 1028 and the p-channel transistor 1030. The insulating layer 1034 may be formed using an organic material having heat resistance, such as polyimide, acrylic, benzocyclobutene, polyamide, or epoxy. In addition to such organic materials, it is also possible to use a low-dielectric constant material (a low-k material), a siloxane-based resin, silicon oxide, silicon nitride, silicon oxynitride, silicon nitride oxide, phosphosilicate glass (PSG), borophosphosilicate glass (BPSG), alumina, or the like. Here, the siloxane-based resin corresponds to a resin including a Si—O—Si bond which is formed using a siloxane-based material as a starting material. The siloxane-based resin may include, besides hydrogen, at least one of fluorine, an alkyl group, or aromatic hydrocarbon as a substituent. Alternatively, the insulating layer 1034 may be formed by stacking plural insulating layers using any of these materials.

For the formation of the insulating layer 1034, the following method can be employed depending on the material of the insulating layer 1034: a CVD method, a sputtering method, an SOG method, a spin coating method, a dipping method, a spray application method, a droplet discharge method (e.g., an ink-jet method, screen printing, offset printing, or the like), a doctor knife, a roll coater, a curtain coater, a knife coater, or the like.

Next, contact holes are formed in the insulating layers 1032 and 1034 so that each of the semiconductor layers 1002 and 1004 is partially exposed. Then, conductive layers 1036 and conductive layers 1038 are formed in contact with the semiconductor layer 1002 and the semiconductor layer 1004, respectively, through the contact holes (see FIG. 12A). The conductive layers 1036 and the conductive layers 1038 each serve as a source electrode or a drain electrode of the respective transistors. Note that in this embodiment mode, as an etching gas for forming the contact holes, a mixed gas of $CHF_3$ and He is employed; however, the etching gas is not limited thereto.

The conductive layers 1036 and the conductive layers 1038 can be formed by a CVD method, a sputtering method, or the like. Specifically, the conductive layers 1036 and the conductive layers 1038 can be formed using aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like. Moreover, an alloy containing the above-described material as its main component or a compound containing the above-described material may be used. The conductive layers 1036 and the conductive layers 1038 may each have a single-layer structure or a stacked structure.

As examples of an alloy containing aluminum as its main component, an alloy containing aluminum as its main component and also containing nickel, and an alloy containing aluminum as its main component and also containing nickel and one or both of carbon and silicon can be given. Since aluminum and aluminum silicon (Al—Si) have low resistance and are inexpensive, aluminum and aluminum silicon are suitable as a material for forming the conductive layers 1036 and the conductive layers 1038. In particular, the aluminum silicon is preferable because a hillock can be prevented from generating due to resist baking at the time of patterning. Further, a material in which Cu is mixed into aluminum at approximately 0.5% may be used instead of silicon.

In the case where each of the conductive layers 1036 and the conductive layers 1038 is formed to have a stacked structure, a stacked structure of a barrier film, an aluminum silicon film, and a barrier film; a stacked structure of a barrier film, an aluminum silicon film, a titanium nitride film, and a barrier film; or the like may be employed, for example. Note that the barrier film refers to a film formed using titanium, a nitride of titanium, molybdenum, a nitride of molybdenum, or the like. By forming the conductive layers so as to sandwich an aluminum silicon film between the barrier films, generation of hillocks of aluminum or aluminum silicon can be further prevented. Moreover, by forming the barrier film using titanium that is a highly reducible element, even if a thin oxide film is formed over the semiconductor layers 1002 and 1004, the oxide film is reduced by the titanium contained in the barrier film, whereby preferable contact between the conductive layers 1036 and the semiconductor layer 1002 and between the conductive layers 1038 and the semiconductor layer 1004 can be obtained. Further, it is also possible to stack a plurality of barrier films. In that case, for example, each of the conductive layers 1036 and the conductive layers 1038 can be formed to have a five-layer structure of titanium, titanium nitride, aluminum silicon, titanium, and titanium nitride in order from the bottom or a stacked structure of more than five layers.

For the conductive layers 1036 and the conductive layers 1038, tungsten silicide formed by a chemical vapor deposition method using a $WF_6$ gas and a $SiH_4$ gas may be used. Alternatively, tungsten formed by hydrogen reduction of $WF_6$ may be used as the conductive layers 1036 and 1038.

Note that the conductive layers 1036 are connected to the high-concentration impurity regions 1016 of the n-channel transistor 1028. The conductive layers 1038 are connected to the high-concentration impurity regions 1022 of the p-channel transistor 1030.

Figure 12A:
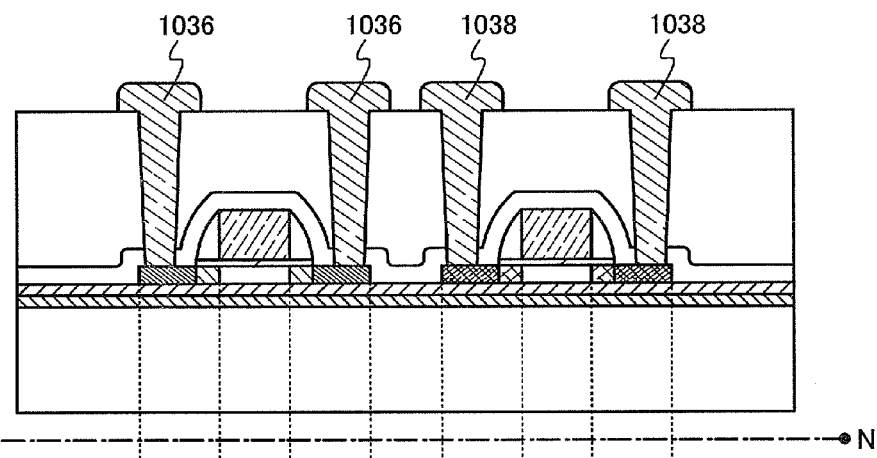
FIGS. 12A and 12B are a plan view and a cross-sectional view, respectively, of a semiconductor device.
Figure 12B:
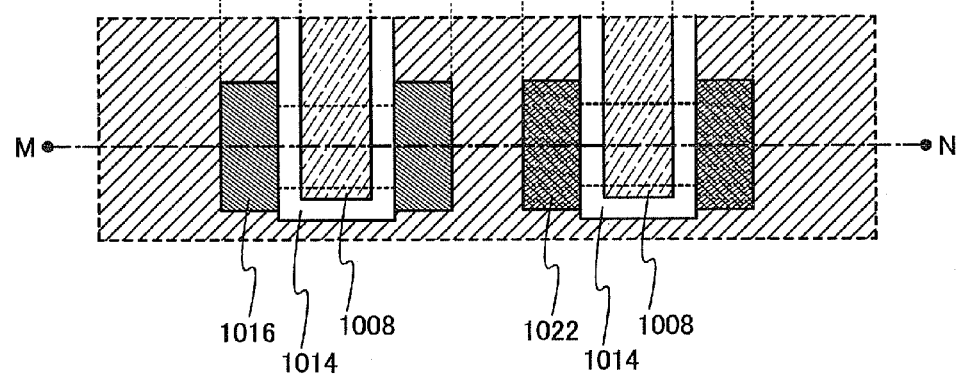

FIG. 12B is a plan view of the n-channel transistor 1028 and the p-channel transistor 1030 which are illustrated in FIG. 12A. Here, the cross section taken along the line M-N in FIG. 12B corresponds to the cross-sectional view of FIG. 12A. However, in FIG. 12B, the conductive layers 1036, the conductive layers 1038, the insulating layers 1032 and 1034, and the like are omitted for simplicity.

Note that although the case where each of the n-channel transistor 1028 and the p-channel transistor 1030 includes one electrode 1008 serving as the gate electrode is described as an example in this embodiment mode, the invention disclosed in this specification is not limited to this structure. The transistor may have a multi-gate structure in which a plurality of electrodes serving as gate electrodes are included and electrically connected to one another.

In this embodiment mode, defects and surface unevenness of a single crystal semiconductor layer are reduced by performing laser irradiation instead of performing mechanical polishing treatment or the like. Further, an evaluation method of the invention disclosed in this specification is used; accordingly, laser irradiation conditions can be optimized by a very easy method. Thus, an SOI substrate with high planarity in which defects are sufficiently reduced can be provided at reduced cost. Furthermore, by using such an SOI substrate, it is possible to manufacture, at low cost, a transistor which has a low subthreshold value and a high field-effect mobility and can operate at high speed and can be driven at low voltage.

This embodiment mode can be implemented in combination with any of Embodiment Modes 1 to 3 as appropriate.

Embodiment Mode 5

In Embodiment Mode 5, another example of a manufacturing method of a thin film transistor which can be used for a semiconductor device will be described. Note that as a feature of a manufacturing method of a thin film transistor described in this embodiment mode, an opening for connecting a semiconductor layer to a wiring is formed in a self-aligned manner.

First, a semiconductor substrate manufactured by a method described in Embodiment Mode 1 or the like is prepared (not illustrated). Then, a semiconductor layer (corresponding to the island-shaped semiconductor layer 124 in Embodiment Mode 1) in the semiconductor substrate is patterned to form an island-shaped semiconductor layer 1306, and an insulating layer 1308 serving as a gate insulating layer and a conductive layer serving as a gate electrode (or a wiring) are sequentially formed. In this embodiment mode, the conductive layer serving as a gate electrode is formed to have a two-layer structure; however, the invention disclosed in this specification is not limited to this. Here, the insulating layer 1308 can be formed using a material such as silicon oxide, silicon oxynitride, silicon nitride oxide, silicon nitride, or the like by a CVD method, a sputtering method, or the like. The thickness of the insulating layer 1308 may be approximately equal to or greater than 5 nm and equal to or less than 100 nm. In addition, the conductive layer can be formed using a material such as tantalum (Ta), tungsten (W), titanium (Ti), molybdenum (Mo), aluminum (Al), copper (Cu), chromium (Cr), niobium (Nb), or the like by a CVD method, a sputtering method, or the like. The total thickness of the two layers of the conductive layer may be approximately equal to or greater than 100 nm and equal to or less than 500 nm. Note that in this embodiment mode, the case where the insulating layer 1308 is formed using silicon oxide (with a thickness of 20 nm), a conductive layer (a lower layer) is formed using tantalum oxide (with a thickness of 50 nm), and a conductive layer (an upper layer) is formed using tungsten (with a thickness of 200 nm) will be described.

Note that an impurity element imparting p-type conductivity such as boron, aluminum, or gallium or an impurity element imparting n-type conductivity such as phosphorus or arsenic may be added to the above-described semiconductor layer in order to control a threshold voltage of a thin film transistor. For example, in the case of adding boron as an impurity element imparting p-type conductivity, boron may be added at a concentration of equal to or higher than $5 \times 10^{16}$ $cm^{-3}$ and equal to or lower than $1 \times 10^{17}$ $cm^{-3}$. Further, hydrogenation treatment may be performed on the semiconductor layer. The hydrogenation treatment is performed, for example, at 350° C. in a hydrogen atmosphere for approximately two hours.

Next, the above-described conductive layers serving as a gate electrode are patterned. Note that patterning is performed on the conductive layers at least twice in the manufacturing method of a thin film transistor of this embodiment mode. Here, the first patterning is performed. Accordingly, a conductive layer 1310 and a conductive layer 1312, which have a size slightly larger than the final shape of the gate electrode, are formed. Here, the "slightly large size" means a size capable of forming a resist mask for formation of a gate electrode, which is used in the second patterning step, in accordance with the position of the conductive layer 1310 and the conductive layer 1312. Note that the two patterning steps may be performed on the region of the conductive layers, which overlaps with the island-shaped semiconductor layer 1306, and need not be performed on the entire conductive layers.

Figure 13A:
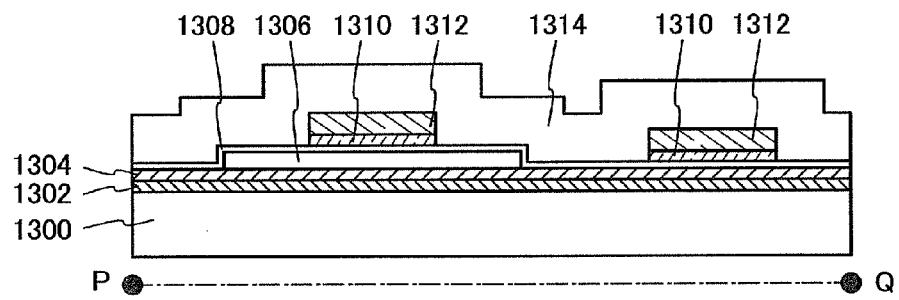
FIGS. 13A to 13D are cross-sectional views illustrating an example of a manufacturing method of a thin film transistor.
Figure 15A:
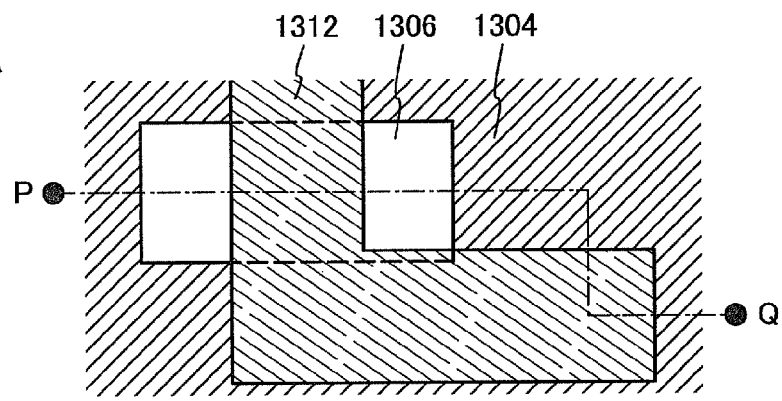
FIGS. 15A to 15D are plan views of an example of a manufacturing method of a thin film transistor.

Then, an insulating layer 1314 is formed to cover the insulating layer 1308, the conductive layers 1310, and the conductive layers 1312 (see FIG. 13A and FIG. 15A). Here, the insulating layer 1314 can be formed using silicon oxide, silicon oxynitride, silicon nitride oxide, silicon nitride, hafnium oxide, aluminum oxide, or the like by a CVD method, a sputtering method, or the like. The thickness of the insulating layer 1314 is preferably approximately equal to or greater than 0.5 μm and equal to or less than 2 μm. In this embodiment mode, the case where the insulating layer 1314 is formed using silicon oxide (with a thickness of 1 μm) will be described as an example. In this embodiment mode, description is made using a semiconductor substrate having a structure in which an insulating layer 1302, an insulating layer 1304, and the semiconductor layer are sequentially provided over a base substrate 1300; however, the invention disclosed in this specification is not interpreted as being limited to this.

Figure 13B:
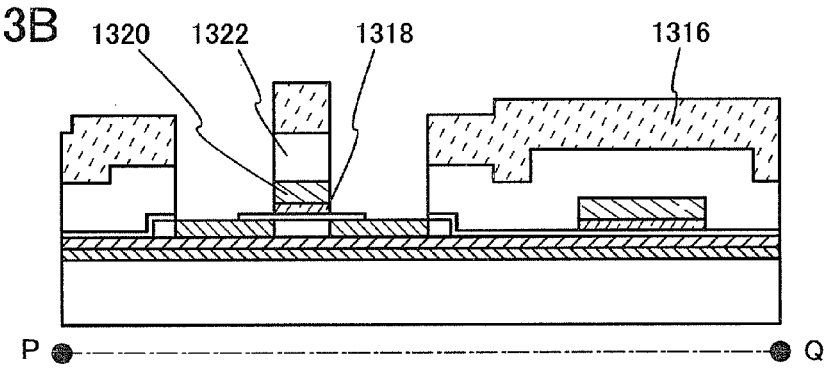

FIG. 13A is a view corresponding to a cross section taken along the line P-Q in FIG. 15A which is a plan view. Similarly, FIG. 13B and FIG. 15B correspond to each other, FIG. 13D and FIG. 15C correspond to each other, and FIG. 14C and FIG. 15D correspond to each other. In the plan views of FIGS. 15A to 15D, part of components illustrated in the corresponding cross-sectional views is omitted for simplicity.

Next, a resist mask 1316 for formation of a gate electrode, which is used in a patterning step, is formed over the insulating layer 1314. This patterning step corresponds to the second patterning step of the two patterning steps performed on the conductive layers. The resist mask 1316 can be formed in such a manner that a resist material which is a photosensitive substrate is applied and then exposed to light to form a pattern. After the formation of the resist mask 1316, the conductive layer 1310, the conductive layer 1312, and the insulating layer 1314 are patterned using the resist mask 1316. Specifically, the insulating layer 1314 is selectively etched to form an insulating layer 1322, and then the conductive layer 1310 and the conductive layer 1312 are selectively etched to form a conductive layer 1318 and a conductive layer 1320 which serve as a gate electrode (see FIG. 13B and FIG. 15B). Here, in selective etching of the insulating layer 1314, part of the insulating layer 1308 serving as a gate insulating layer is also etched.

Next, after removing the resist mask 1316, an insulating layer 1324 is formed so as to cover the island-shaped semiconductor layer 1306, the insulating layer 1308, the conductive layer 1318, the conductive layer 1320, the insulating layer 1322, and the like. The insulating layer 1324 serves as a barrier layer in later formation of sidewalls. The insulating layer 1324 can be formed using a material such as silicon oxide, silicon oxynitride, silicon nitride oxide, silicon nitride, hafnium oxide, aluminum oxide, tantalum oxide, or the like. To make the insulating layer 1324 serve as a barrier layer, the insulating layer 1324 is preferably formed using a material with respect to which a material used for the sidewalls later has a high etching selectivity. The thickness of the insulating layer 1324 may be approximately equal to or greater than 10 nm and equal to or less than 200 nm. In this embodiment mode, the insulating layer 1324 is formed using silicon nitride (with a thickness of 50 nm).

Figure 13C:
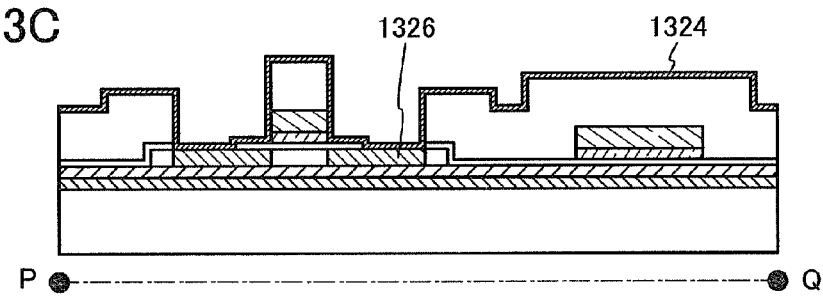

After the formation of the insulating layer 1324, an impurity element imparting one conductivity type is added to the island-shaped semiconductor layer 1306 using the conductive layer 1318, the conductive layer 1320, the insulating layer 1322, and the like as masks. In this embodiment mode, an impurity element imparting n-type conductivity (e.g., phosphorus or arsenic) is added to the island-shaped semiconductor layer 1306. By the addition of the impurity element, impurity regions 1326 are formed in the island-shaped semiconductor layer 1306 (see FIG. 13C). Note that the impurity element imparting n-type conductivity is added after the formation of the insulating layer 1324 in this embodiment mode; however, the invention disclosed in this specification is not limited to this. For example, after or before removal of the resist mask, the above-described impurity element may be added and then the insulating layer 1324 may be formed. Further, the impurity element for addition can be an impurity element imparting p-type conductivity.

Figure 13D:
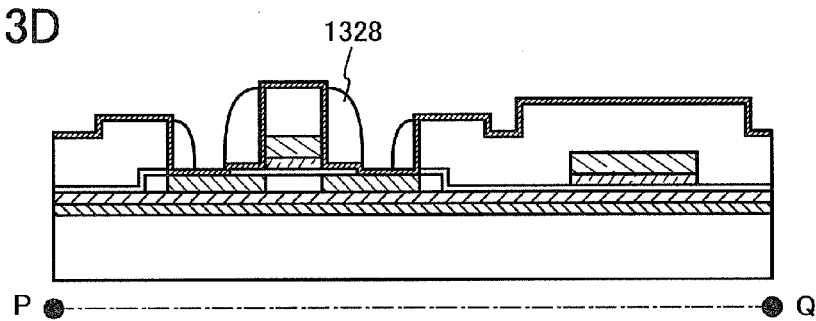
Figure 15B:
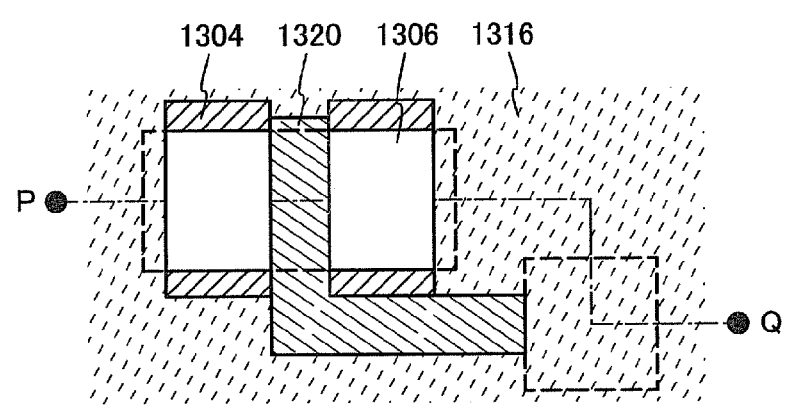
Figure 15C:
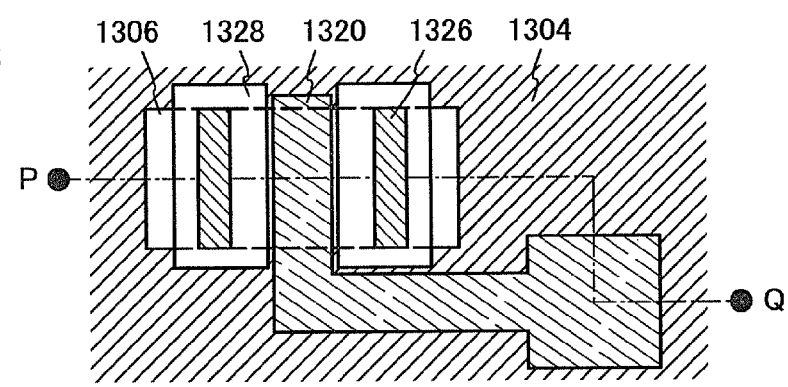

Next, sidewalls 1328 are formed (see FIG. 13D and FIG. 15C). The sidewalls 1328 can be formed in such a manner that an insulating layer is formed so as to cover the insulating layer 1324 and anisotropic etching mainly in a perpendicular direction is performed on the insulating layer. The anisotropic etching is used because the insulating layer is selectively etched. The insulating layer can be formed using silicon oxide, silicon oxynitride, silicon nitride oxide, silicon nitride, hafnium oxide, aluminum oxide, tantalum oxide, or the like by a CVD method, a sputtering method, or the like. Alternatively, a film containing an organic material may be formed by spin coating or the like. In this embodiment mode, silicon oxide is used as a material of the insulating layer. In other words, the sidewalls 1328 are formed using silicon oxide. In addition, as an etching gas used in the above etching, a mixed gas of $CHF_3$ and helium can be used, for example. Note that the process of forming the sidewalls 1328 are not limited to these.

Next, an impurity element imparting one conductivity type is added to the island-shaped semiconductor layer 1306 using the insulating layer 1322 and the sidewalls 1328 as masks. Note that the impurity element imparting the same conductivity type as the impurity element which has been added to the island-shaped semiconductor layer 1306 in the previous step is added to the island-shaped semiconductor layer 1306 at higher concentration than that in the previous step. That is, in this embodiment mode, the impurity element imparting n-type conductivity is added.

By the addition of the impurity element, a channel formation region 1330, low-concentration impurity regions 1332, and high-concentration impurity regions 1334 are formed in the island-shaped semiconductor layer 1306. The low-concentration impurity regions 1332 serve as LDD (lightly doped drain) regions and the high-concentration impurity regions 1334 serve as a source and a drain.

Figure 14A:
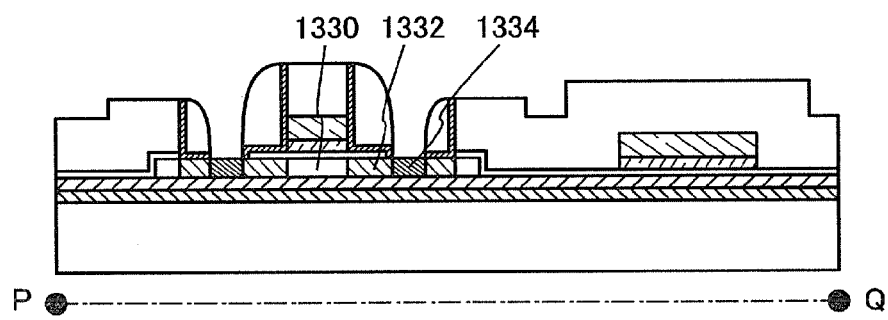
FIGS. 14A to 14C are cross-sectional views illustrating an example of a manufacturing method of a thin film transistor.

Next, the insulating layer 1324 is etched to form openings (contact holes) which reach the high-concentration impurity regions (see FIG. 14A). Since the insulating layer 1322 and the sidewalls 1328 are formed using silicon oxide and the insulating layer 1324 is formed using silicon nitride in this embodiment mode, the insulating layer 1324 can be selectively etched to form the openings.

Figure 14B:
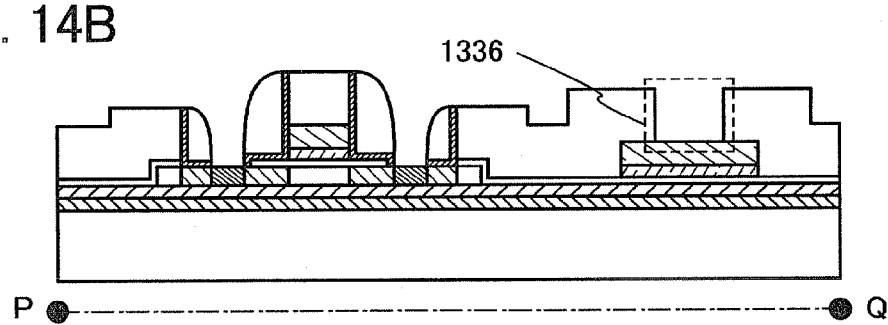

After the formation of the openings which reach the high-concentration impurity regions, an opening 1336 is formed by selective etching of the insulating layer 1314 (see FIG. 14B). The opening 1336 is formed larger than each of the openings which reach the high-concentration impurity regions. This is because the minimum line width of the opening 1336 is determined based on the process rule or the design rule whereas the openings which reach the high-concentration impurity regions are formed in a self-aligned manner and, therefore, formed small.

Then, a conductive layer which is in contact with the high-concentration impurity regions 1334 of the island-shaped semiconductor layer 1306 and the conductive layer 1312 through the openings which reach the high-concentration impurity regions and the opening 1336 is formed. The conductive layer can be formed by a CVD method, a sputtering method, or the like. Specifically, as a material of the conductive layer, aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like can be used. Moreover, an alloy containing the above-described metal as its main component or a compound containing the above-described metal may be used. Further, the conductive layer may have either a single-layer structure or a stacked structure. In this embodiment mode, the case where the conductive layer has a three-layer structure of titanium, aluminum, and titanium is described.

Figure 14C:
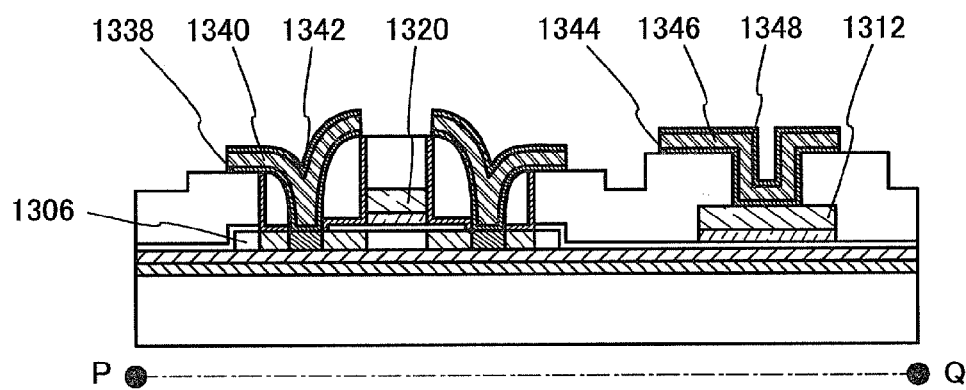
Figure 15D:
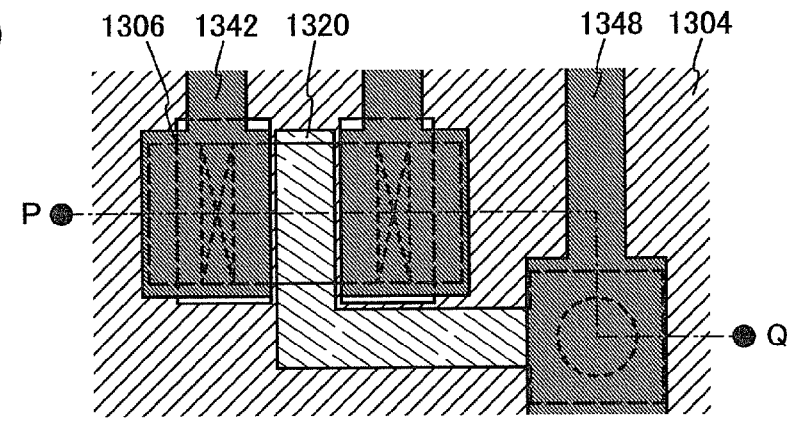

The conductive layer is selectively etched to form conductive layers 1338, conductive layers 1340, and conductive layers 1342, each of which serves as a source electrode or a drain electrode (a source wiring or a drain wiring), a conductive layer 1344, a conductive layer 1346, and a conductive layer 1348, each of which serves as a wiring connected to the conductive layer 1312 (see FIG. 14C and FIG. 15D). In the above-described process, a thin film transistor in which the island-shaped semiconductor layer 1306 is connected to the conductive layers serving as a source electrode and a drain electrode in a self-aligned manner is completed.

Since the island-shaped semiconductor layer can be connected to the source electrode and the drain electrode in a self-aligned manner by the method described in this embodiment mode, miniaturization of the structure of the transistor can be performed. That is, the degree of integration of a semiconductor element can be increased. Further, since the channel length or the length of a low-concentration impurity region can be determined in a self-aligned manner, variation in channel resistance, which is a problem in miniaturization, can be suppressed. That is, a transistor with excellent characteristics can be provided.

This embodiment mode can be implemented in combination with any of Embodiment Modes 1 to 4 as appropriate.

Embodiment Mode 6

In Embodiment Mode 6, an electronic device using a semiconductor device manufactured in Embodiment Mode 4 or 5, particularly using a display device will be described with reference to FIGS. 16A to 16H and FIGS. 17A to 17C.

As electronic devices manufactured using a semiconductor device (particularly a display device), the following can be given: cameras such as a video camera and a digital camera, goggle-type displays (head mounted displays), navigation systems, audio reproducing devices (such as car audio components), computers, game machines, portable information terminals (such as a mobile computer, a cellular phone, a portable game machine, and an e-book reader), and image reproducing devices provided with a recording medium (specifically, a device provided with a display device that can reproduce a recording medium such as a digital versatile disc (DVD) and display the image), and the like.

Figure 16A:
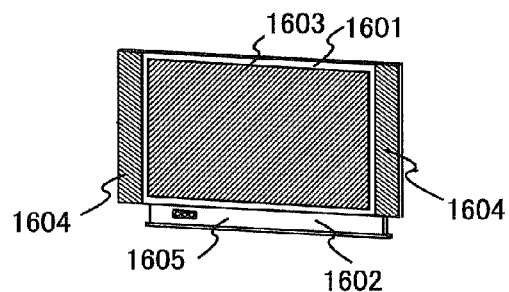
FIGS. 16A to 16H illustrate electronic devices each of which uses a semiconductor device.

FIG. 16A illustrates a television set or a monitor of a personal computer. The television set or the monitor of the personal computer includes a housing 1601, a support stand 1602, a display portion 1603, speaker portions 1604, a video input terminal 1605, and the like. A semiconductor device of the invention disclosed in this specification is used in the display portion 1603. Accordingly, a television set or a monitor of a personal computer having high reliability and high performance can be provided at low cost.

Figure 16B:
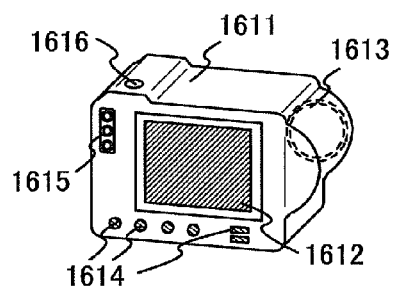

FIG. 16B illustrates a digital camera. An image receiving portion 1613 is provided in the front side of a main body 1611. A shutter button 1616 is provided at the upper portion of the main body 1611. A display portion 1612, operation keys 1614, and an external connection port 1615 are provided at the backside of the main body 1611. A semiconductor device of the invention disclosed in this specification is used in the display portion 1612. Accordingly, a digital camera having high reliability and high performance can be provided at low cost.

Figure 16C:
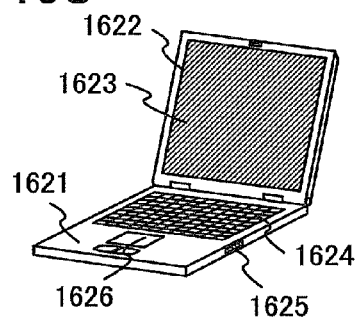

FIG. 16C illustrates a notebook personal computer. A main body 1621 is provided with a keyboard 1624, an external connection port 1625, and a pointing device 1626. A housing 1622 including a display portion 1623 is attached to the main body 1621. The semiconductor device of the invention disclosed in this specification is used in the display portion 1623. Accordingly, a notebook personal computer having high reliability and high performance can be provided at low cost.

Figure 16D:
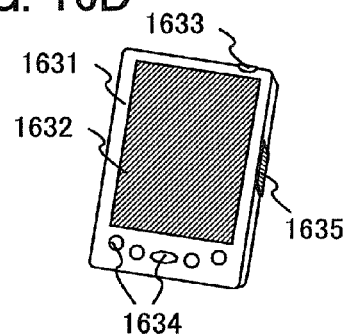

FIG. 16D illustrates a mobile computer including a main body 1631, a display portion 1632, a switch 1633, operation keys 1634, an infrared port 1635, and the like. An active matrix display device is provided in the display portion 1632. A semiconductor device of the invention disclosed in this specification is used in the display portion 1632. Accordingly, a mobile computer having high reliability and high performance can be provided at low cost.

Figure 16E:
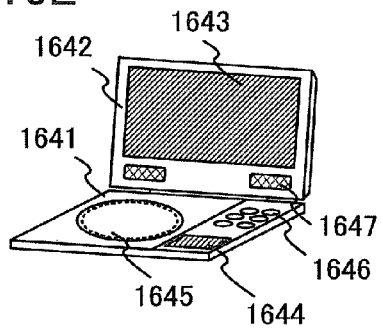

FIG. 16E illustrates an image reproducing device. A main body 1641 is provided with a display portion 1644, a recording medium reading portion 1645, and operation keys 1646. Furthermore, a housing 1642 that has speaker portions 1647 and a display portion 1643 is attached to the main body 1641. A semiconductor device of the invention disclosed in this specification is used in each of the display portion 1643 and the display portion 1644. Accordingly, an image reproducing device having high reliability and high performance can be provided at low cost.

Figure 16F:
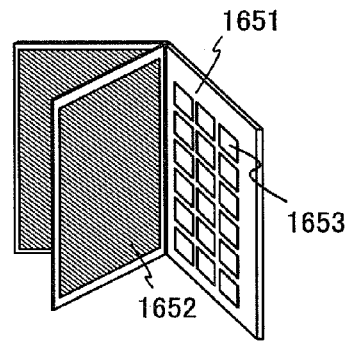

FIG. 16F illustrates an e-book reader. A main body 1651 is provided with operation keys 1653. A plurality of display portions 1652 are attached to the main body 1651. A semiconductor device of the invention disclosed in this specification is used in the display portions 1652. Accordingly, an e-book reader having high reliability and high performance can be provided at low cost.

Figure 16G:
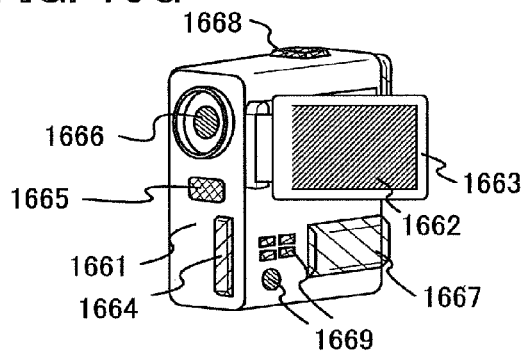

FIG. 16G illustrates a video camera. A main body 1661 is provided with an external connection port 1664, a remote control receiving portion 1665, an image receiving portion 1666, a battery 1667, an audio input portion 1668, and operation keys 1669. A housing 1663 including a display portion 1662 is attached to the main body 1661. A semiconductor device of the invention disclosed in this specification is used in the display portion 1662. Accordingly, a video camera having high reliability and high performance can be provided at low cost.

Figure 16H:
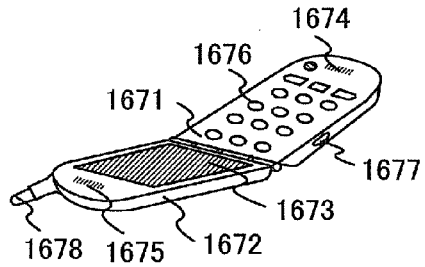

FIG. 16H illustrates a cellular phone, which includes a main body 1671, a housing 1672, a display portion 1673, an audio input portion 1674, an audio output portion 1675, operation keys 1676, an external connection port 1677, an antenna 1678, and the like. A semiconductor device of the invention disclosed in this specification is used in the display portion 1673. Accordingly, a cellular phone having high reliability and high performance can be provided at low cost.

Figure 17A:
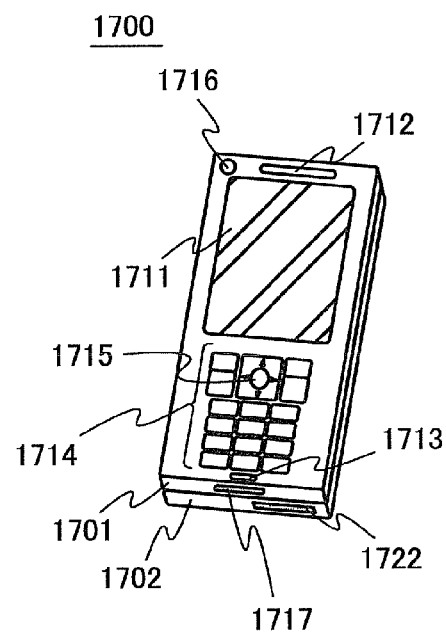
FIGS. 17A to 17C illustrate an electronic device which uses a semiconductor device.
Figure 17B:
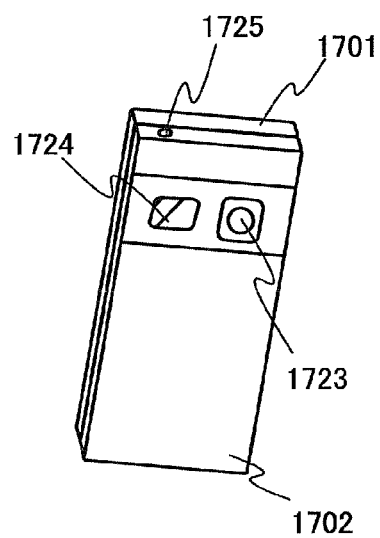
Figure 17C:
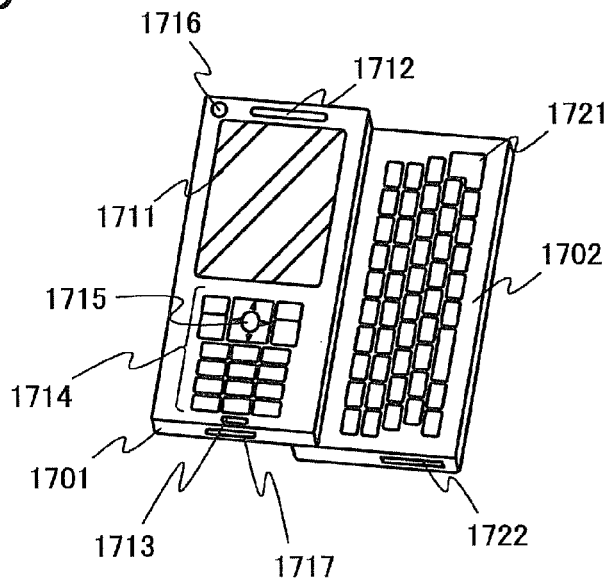

FIGS. 17A to 17C illustrate a structural example of a portable electronic device 1700 having functions as a telephone and an information terminal. Here, FIG. 17A is a front view, FIG. 17B is a back view, and FIG. 17C is a developed view. The portable electronic device 1700 has functions as both a telephone and an information terminal and is an electronic device so-called a smartphone which is capable of various data processing besides voice call.

The portable electronic device 1700 includes housings 1701 and 1702. The housing 1701 is provided with a display portion 1711, a speaker 1712, a microphone 1713, operation keys 1714, a pointing device 1715, a lens 1716 for camera, an external connection terminal 1717, and the like. The housing 1702 is provided with a keyboard 1721, an external memory slot 1722, a lens 1723 for camera, a light 1724, an earphone terminal 1725, and the like. In addition, an antenna is incorporated in the housing 1701. In addition to the above-described structure, a wireless IC chip, a small size memory device, or the like can be built therein.

The display portion 1711 includes a semiconductor device according to the invention disclosed in this specification. An image displayed (and direction in which the image is displayed) in the display portion 1711 variously changes depending on the usage mode of the portable electronic device 1700. Moreover, since the display portion 1711 and the lens 1716 for camera are provided on the same plane, voice call with images (so-called videophone) is possible. Note that the speaker 1712 and the microphone 1713 can be used not only for voice call but also for recording, reproducing, or the like. In the case where a still image and a moving image are shot by using the lens 1723 for camera (and the light 1724), the display portion 1711 is used as a finder. The operation keys 1714 are used for operation of incoming and outgoing calls, simple information input for electronic mail or the like, scrolling of a screen, cursor motion, and the like.

The housings 1701 and 1702 overlapped with each other (FIG. 17A) slide and can be developed as illustrated in FIG. 17C, so that the portable electronic device 1700 can be used as an information terminal. In that case, smooth operation with the keyboard 1721 and the pointing device 1715 can be performed. The external connection terminal 1717 can be connected to various cables such as an AC adopter or a USB cable, whereby the portable electronic device 1700 can be charged or can perform data communication with a computer or the like. Moreover, by inserting a recording medium into the external memory slot 1722, the portable electronic device 1700 can deal with storing and moving a large capacity of data. In addition to the above-described functions, a function of wireless communication by using electromagnetic waves such as infrared rays, a function of receiving television, and the like may be included. By using the invention disclosed in this specification, a portable electronic device having high reliability and high performance can be provided at low cost.

In the above-described manner, the invention disclosed in this specification is capable of quite wide application, and can be thus used for electronic devices in all fields. This embodiment mode can be implemented in combination with any of Embodiment Modes 1 to 5 as appropriate.

This application is based on Japanese Patent Application serial no. 2008-014147 filed with Japan Patent Office on Jan. 24, 2008, the entire contents of which are hereby incorporated by reference.

What is claimed is:

1. A manufacturing method of a semiconductor substrate, comprising the steps of:
   irradiating a single crystal semiconductor substrate with hydrogen ions to form a damaged region, wherein the damaged region contains hydrogen at a concentration of equal to or higher than $1 \times 10^{20}$ atoms/cm$^3$;
   forming an insulating layer over the single crystal semiconductor substrate;
   bonding a substrate and the single crystal semiconductor substrate with the insulating layer interposed therebetween;
   separating the single crystal semiconductor substrate at the damaged region to form a single crystal semiconductor layer over the substrate;
   patterning the single crystal semiconductor layer to form a plurality of island-shaped semiconductor layers; and
   irradiating at least one of the plurality of island-shaped semiconductor layers with a laser beam which is shaped to entirely cover the at least one of the plurality of island-shaped semiconductor layers.

2. The manufacturing method of a semiconductor substrate according to claim 1, wherein the at least one of the plurality of island-shaped semiconductor layers is irradiated with a center portion of the laser beam.

3. The manufacturing method of a semiconductor substrate according to claim 2, wherein the center portion of the laser beam is a portion having an intensity of equal to or higher than 80% of a peak intensity of the laser beam.

4. The manufacturing method of a semiconductor substrate according to claim 1, wherein the irradiation with the laser beam is performed in a reduced-pressure atmosphere.

5. The manufacturing method of a semiconductor substrate according to claim 1, further comprising the steps of:
   evaluating a melted state of the at least one of the plurality of island-shaped semiconductor layers during the irradiation with the laser beam;
   judging the melted state of the at least one of the plurality of island-shaped semiconductor layers whether melted or unmelted; and
   irradiating at least one of the plurality of island-shaped semiconductor layers with a laser beam which is shaped to entirely cover the at least one of the plurality of island-shaped semiconductor layers after judging that the at least one of the plurality of island-shaped semiconductor layers is unmelted.

6. The manufacturing method of a semiconductor substrate according to claim 5,
   wherein the evaluating step comprises the steps of:
   irradiating a top surface or a rear surface of the at least one of the plurality of island-shaped semiconductor layers with a reference laser beam having a predetermined wavelength; and
   measuring a reflectance of the reference laser beam,
   wherein a result of the judging the melted state of the at least one of the plurality of island shaped semiconductor layers is selected from an unmelted state, a partially-melted state and a completely-melted state based on the measured reflectance of the reference laser beam.

7. The manufacturing method of a semiconductor substrate according to claim 6,
wherein a first reflectance and a second reflectance are used in the judging step,
wherein the first reflectance is a reflectance when the top surface of the at least one of the plurality of island-shaped semiconductor layers is melted, and
wherein the second reflectance is a reflectance when the rear surface of the at least one of the plurality of island-shaped semiconductor layers is melted.

8. The manufacturing method of a semiconductor substrate according to claim 1, wherein the hydrogen ion contains $H_3^+$ ions, and a proportion of the $H_3^+$ ions is equal to or higher than 80%.

9. A manufacturing method of a semiconductor substrate, comprising the steps of:
irradiating a single crystal semiconductor substrate with hydrogen ions to form a damaged region, wherein the damaged region contains hydrogen at a concentration of equal to or higher than $1\times10^{20}$ atoms/cm$^3$;
patterning the single crystal semiconductor substrate to form a recessed portion, a bottom of which is deeper than the damaged region;
forming an insulating layer over the single crystal semiconductor substrate;
bonding a substrate and the single crystal semiconductor substrate with the insulating layer interposed therebetween;
separating the single crystal semiconductor substrate at the damaged region to form a plurality of island-shaped semiconductor layers over the substrate; and
irradiating at least one of the plurality of island-shaped semiconductor layers with a laser beam which is shaped to entirely cover the at least one of the plurality of island-shaped semiconductor layers.

10. The manufacturing method of a semiconductor substrate according to claim 9, wherein the at least one of the plurality of island-shaped semiconductor layers is irradiated with a center portion of the laser beam.

11. The manufacturing method of a semiconductor substrate according to claim 10, wherein the center portion of the laser beam is a portion having an intensity of equal to or higher than 80% of a peak intensity of the laser beam.

12. The manufacturing method of a semiconductor substrate according to claim 9, wherein the irradiation with the laser beam is performed in a reduced-pressure atmosphere.

13. The manufacturing method of a semiconductor substrate according to claim 9, further comprising the steps of:
evaluating a melted state of the at least one of the plurality of island-shaped semiconductor layers during the irradiation with the laser beam;
judging the melted state of the at least one of the plurality of island-shaped semiconductor layers whether melted or unmelted; and
irradiating at least one of the plurality of island-shaped semiconductor layers with a laser beam which is shaped to entirely cover the at least one of the plurality of island-shaped semiconductor layers after judging that the at least one of the plurality of island-shaped semiconductor layers is unmelted.

14. The manufacturing method of a semiconductor substrate according to claim 13,
wherein the evaluating step comprises the steps of:
irradiating a top surface or a rear surface of the at least one of the plurality of island-shaped semiconductor layers with a reference laser beam having a predetermined wavelength; and
measuring a reflectance of the reference laser beam,
wherein a result of the judging the melted state of the at least one of the plurality of island shaped semiconductor layers is selected from an unmelted state, a partially-melted state and a completely-melted state from the measured reflectance of the reference laser beam.

15. The manufacturing method of a semiconductor substrate according to claim 14,
wherein a first reflectance and a second reflectance are used in the judging step,
wherein the first reflectance is a reflectance when the top surface of the at least one of the plurality of island-shaped semiconductor layers is melted, and
wherein the second reflectance is a reflectance when the rear surface of the at least one of the plurality of island-shaped semiconductor layers is melted.

16. The manufacturing method of a semiconductor substrate according to claim 9, wherein the hydrogen ion contains $H_3^+$ ions, and a proportion of the $H_3^+$ ions is equal to or higher than 80%.

17. A manufacturing method of a semiconductor device, comprising the steps of:
irradiating a single crystal semiconductor substrate with hydrogen ions to form a damaged region, wherein the damaged region contains hydrogen at a concentration of equal to or higher than $1\times10^{20}$ atoms/cm$^3$;
forming an insulating layer over the single crystal semiconductor substrate;
bonding a substrate and the single crystal semiconductor substrate with the insulating layer interposed therebetween;
separating the single crystal semiconductor substrate at the damaged region to form a single crystal semiconductor layer over the substrate;
patterning the single crystal semiconductor layer to form a plurality of first island-shaped semiconductor layers;
irradiating at least one of the plurality of first island-shaped semiconductor layers with a laser beam which is shaped to entirely cover the at least one of the plurality of first island-shaped semiconductor layers;
patterning the plurality of first island-shaped semiconductor layers to form a second island-shaped semiconductor layer; and
forming a gate electrode over the second island-shaped semiconductor layer with a gate insulating layer interposed therebetween.

18. The manufacturing method of a semiconductor device according to claim 17, wherein the at least one of the plurality of first island-shaped semiconductor layers is irradiated with a center portion of the laser beam.

19. The manufacturing method of a semiconductor device according to claim 18, wherein the center portion of the laser beam is a portion having an intensity of equal to or higher than 80% of a peak intensity of the laser beam.

20. The manufacturing method of a semiconductor device according to claim 17, wherein the irradiation with the laser beam is performed in a reduced-pressure atmosphere.

21. The manufacturing method of a semiconductor device according to claim 17, further comprising the steps of:
evaluating a melted state of the at least one of the plurality of first island-shaped semiconductor layers during the irradiation with the laser beam;
judging the melted state of the at least one of the plurality of first island-shaped semiconductor layers whether melted or unmelted; and
irradiating at least one of the plurality of first island-shaped semiconductor layers with a laser beam which is shaped to entirely cover the at least one of the plurality of first island-shaped semiconductor layers after judging that the at least one of the plurality of first island-shaped semiconductor layers is unmelted.

22. The manufacturing method of a semiconductor device according to claim 21,
wherein the evaluating step comprises the steps of:
irradiating a top surface or a rear surface of the at least one of the plurality of first island-shaped semiconductor layers with a reference laser beam having a predetermined wavelength; and
measuring a reflectance of the reference laser beam,
wherein a result of the judging the melted state of the at least one of the plurality of first island-shaped semiconductor layers is selected from an unmelted state, a partially-melted state and a completely-melted state based on the measured reflectance of the reference laser beam.

23. The manufacturing method of a semiconductor device according to claim 22,
wherein a first reflectance and a second reflectance are used in the judging step,
wherein the first reflectance is a reflectance when the top surface of the at least one of the plurality of first island-shaped semiconductor layers is melted, and
wherein the second reflectance is a reflectance when the rear surface of the at least one of the plurality of first island-shaped semiconductor layers is melted.

24. The manufacturing method of a semiconductor device according to claim 17, wherein the hydrogen ion contains $H_3^+$ ions, and a proportion of the $H_3^+$ ions is equal to or higher than 80%.

25. A manufacturing method of a semiconductor device, comprising the steps of:
irradiating a single crystal semiconductor substrate with hydrogen ions to form a damaged region, wherein the damaged region contains hydrogen at a concentration of equal to or higher than $1\times10^{20}$ atoms/cm$^3$;
patterning the single crystal semiconductor substrate to form a recessed portion, a bottom of which is deeper than the damaged region;
forming an insulating layer over the single crystal semiconductor substrate;
bonding a substrate and the single crystal semiconductor substrate with the insulating layer interposed therebetween;
separating the single crystal semiconductor substrate at the damaged region to form a plurality of first island-shaped semiconductor layers over the substrate;
irradiating at least one of the plurality of first island-shaped semiconductor layers with a laser beam which is shaped to entirely cover the at least one of the plurality of first island-shaped semiconductor layers;
patterning the plurality of first island-shaped semiconductor layers to form a second island-shaped semiconductor layer; and
forming a gate electrode over the second island-shaped semiconductor layer with a gate insulating layer interposed therebetween.

26. The manufacturing method of a semiconductor device according to claim 25, wherein the at least one of the plurality of first island-shaped semiconductor layers is irradiated with a center portion of the laser beam.

27. The manufacturing method of a semiconductor device according to claim 26, wherein the center portion of the laser beam is a portion having an intensity of equal to or higher than 80% of a peak intensity of the laser beam.

28. The manufacturing method of a semiconductor device according to claim 25, wherein the irradiation with the laser beam is performed in a reduced-pressure atmosphere.

29. The manufacturing method of a semiconductor device according to claim 25, further comprising the steps of:
evaluating a melted state of the at least one of the plurality of first island-shaped semiconductor layers during the irradiation with the laser beam;
judging the melted state of the at least one of the plurality of first island-shaped semiconductor layers whether melted or unmelted; and
irradiating at least one of the plurality of first island-shaped semiconductor layers with a laser beam which is shaped to entirely cover the at least one of the plurality of first island-shaped semiconductor layers after judging that the at least one of the plurality of first island-shaped semiconductor layers is unmelted.

30. The manufacturing method of a semiconductor device according to claim 29,
wherein the evaluating the melted state of the at least one of the plurality of first island-shaped semiconductor layers is performed by steps of:
irradiating a top surface or a rear surface of the at least one of the plurality of first island-shaped semiconductor layers with a reference laser beam having a predetermined wavelength; and
measuring a reflectance of the reference laser beam,
wherein a result of the judging the melted state of the at least one of the plurality of first island shaped semiconductor layers is selected from an unmelted state, a partially-melted state and a completely-melted state from the measured reflectance of the reference laser beam.

31. The manufacturing method of a semiconductor device according to claim 30,
wherein a first reflectance and a second reflectance are used in the judging step,
wherein the first reflectance is a reflectance when the top surface of the at least one of the plurality of first island-shaped semiconductor layers is melted, and
wherein the second reflectance is a reflectance when the rear surface of the at least one of the plurality of first island-shaped semiconductor layers is melted.

32. The manufacturing method of a semiconductor device according to claim 25, wherein the hydrogen ion contains $H_3^+$ ions, and a proportion of the $H_3^+$ ions is equal to or higher than 80%.

* * * * *